United States Patent
Sumbul et al.

(10) Patent No.: US 10,748,603 B2
(45) Date of Patent: Aug. 18, 2020

(54) IN-MEMORY MULTIPLY AND ACCUMULATE WITH GLOBAL CHARGE-SHARING

(71) Applicant: Intel Corporation, Santa Clara, CA (US)

(72) Inventors: Huseyin Ekin Sumbul, Portland, OR (US); Gregory K. Chen, Portland, OR (US); Raghavan Kumar, Hillsboro, OR (US); Phil Knag, Hillsboro, OR (US); Abhishek Sharma, Hillsboro, OR (US); Sasikanth Manipatruni, Portland, OR (US); Amrita Mathuriya, Portland, OR (US); Ram Krishnamurthy, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 16/146,473

(22) Filed: Sep. 28, 2018

(65) Prior Publication Data

US 2019/0043560 A1  Feb. 7, 2019

(51) Int. Cl.
| | | |
|---|---|---|
| *G11C 8/00* | (2006.01) |
| *G11C 11/418* | (2006.01) |
| *G06F 9/30* | (2018.01) |
| *G11C 11/419* | (2006.01) |
| *G11C 13/00* | (2006.01) |

(Continued)

(52) U.S. Cl.
CPC .......... *G11C 11/418* (2013.01); *G06F 9/3001* (2013.01); *G06N 3/0635* (2013.01); *G06N 3/08* (2013.01); *G11C 7/1006* (2013.01); *G11C 7/18* (2013.01); *G11C 11/419* (2013.01); *G11C 11/54* (2013.01); *G11C 13/004* (2013.01); *G11C 13/0026* (2013.01); *G11C 13/0028* (2013.01);

(Continued)

(58) Field of Classification Search
CPC ... G11C 11/418; G06F 9/3001; G06F 3/0635; G06F 3/08
USPC ....................................................... 365/230.01
See application file for complete search history.

(56) References Cited

U.S. PATENT DOCUMENTS 6,658,440 B1 * 12/2003 Pisek ................. H03H 17/0292
708/300
2011/0072204 A1    3/2011 Chang et al.
(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Vu A Le
(74) *Attorney, Agent, or Firm* — Compass IP Law PC

(57) ABSTRACT

A memory circuit has compute-in-memory circuitry that enables a multiply-accumulate (MAC) operation based on shared charge. Row access circuitry drives multiple rows of a memory array to multiply a first data word with a second data word stored in the memory array. The row access circuitry drives the multiple rows based on the bit pattern of the first data word. Column access circuitry drives a column of the memory array when the rows are driven. Accessed rows discharge the column line in an accumulative fashion. Sensing circuitry can sense voltage on the column line. A processor in the memory circuit computes a MAC value based on the voltage sensed on the column.

20 Claims, 12 Drawing Sheets

(51) Int. Cl.
*G11C 7/10* (2006.01)
*G11C 11/54* (2006.01)
*G06N 3/063* (2006.01)
*G06N 3/08* (2006.01)
*G11C 7/18* (2006.01)
*G06F 7/544* (2006.01)
*G11C 11/16* (2006.01)

(52) U.S. Cl.
CPC ........ *G06F 7/5443* (2013.01); *G11C 11/1655* (2013.01); *G11C 11/1657* (2013.01); *G11C 2207/005* (2013.01)

(56) References Cited

U.S. PATENT DOCUMENTS

| 2011/0113115 | A1 | 5/2011 | Chang et al. | |
|---|---|---|---|---|
| 2018/0004687 | A1 | 1/2018 | Bernat et al. | |
| 2018/0315473 | A1* | 11/2018 | Yu | G11C 7/1006 |

OTHER PUBLICATIONS

Biswas, A., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Gonugondla, S.K., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 490-492.

Henzler, S., "Chapter 2, Time-to-Digital Converter Basics", Springer Series in Advanced Microelectronics 29, 2, Springer Science+Business Media B.V. 2010.

Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.

Mason, A., "Memory Basics", Michigan State, ECE 410, Chapter 13 Lecture Notes, pp. 13.1-13.34, 2010.

Solanki, Umang, "How does SRAM work?", https://www.quora.com/How-does-SRAM-work, Aug. 17, 2017, 2 pages.

Stone, Harold S. "A Logic-In-Memory Computer", IEEE Transactions on Computers, Jan. 1970, 6 pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

* cited by examiner

```
BIT-SERIAL MAC CODE 800

Y = a*X_0 + b*X_1

802   i = bit_length(X) – 1;
804   Y = 0; //set initial value for Y
806   while(i >= 0)
808       Y += a*X_0[i] + b*X_1[i];
810       Y = Y << left_shift_by_1;
812       i -= 1;
814   end
```

IN-MEMORY MULTIPLY AND ACCUMULATE WITH GLOBAL CHARGE-SHARING

FIELD

Descriptions are generally related to memory circuits, and more particular descriptions are related to compute-in-memory circuits with multiply and accumulate (MAC) circuits.

BACKGROUND

Computer artificial intelligence (AI) has been built on machine learning, particularly using deep learning techniques. With deep learning, a computing system organized as a neural network computes a statistical likelihood of a match of input data with prior computed data. A neural network refers to a plurality of interconnected processing nodes that enable the analysis of data to compare an input to "trained" data. Trained data refers to computational analysis of properties of known data to develop models to use to compare input data. An example of an application of AI and data training is found in object recognition, where a system analyzes the properties of many (e.g., thousands or more) of images to determine patterns that can be used to perform statistical analysis to identify an input object.

Neural networks compute "weights" to perform computation on new data (an input data "word"). Neural networks use multiple layers of computational nodes, where deeper layers perform computations based on results of computations performed by higher layers. Machine learning currently relies on the computation of dot-products and absolute difference of vectors, typically computed with multiply and accumulate (MAC) operations performed on the parameters, input data and weights. The computation of large and deep neural networks typically involves so many data elements it is not practical to store them in processor cache, and thus they are usually stored in a memory.

Thus, machine learning is very computationally intensive with the computation and comparison of many different data elements. The computation of operations within a processor is orders of magnitude faster than the transfer of data between the processor and main memory resources. Placing all the data closer to the processor in caches is prohibitively expensive for the great majority of practical systems due to the memory sizes needed to store the data. Thus, the transfer of data becomes a major bottleneck for AI computations. As the data sets increase, the time and power/energy a computing system uses for moving data around can end up being multiples of the time and power used to actually perform computations.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1A:
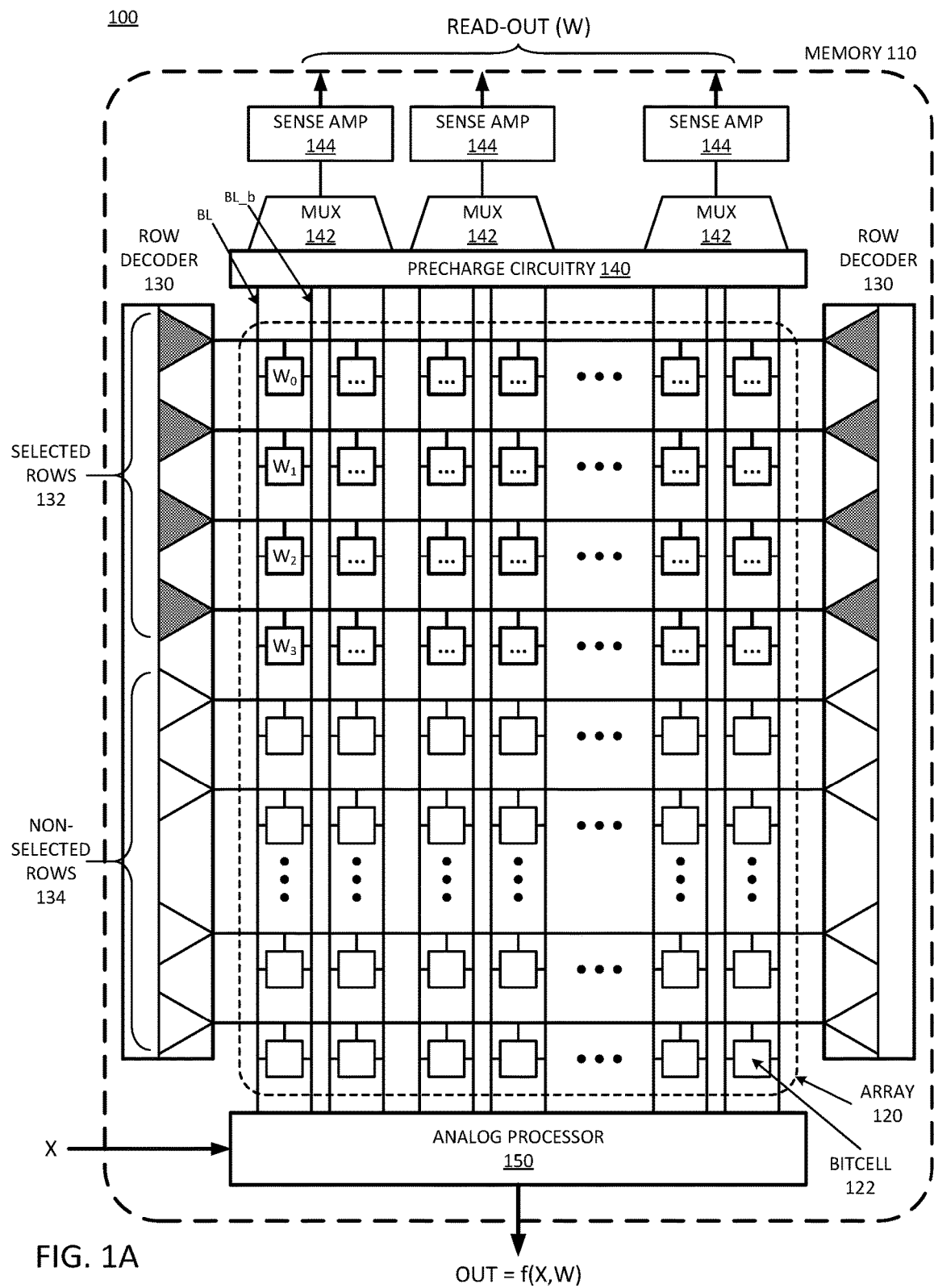
FIG. 1A is a block diagram of an example of a compute-in memory system that performs computations with current summing and charge sharing.

Descriptions of certain details and implementations follow, including non-limiting descriptions of the figures, which may depict some or all examples, and well as other potential implementations.

DETAILED DESCRIPTION

As described herein, compute-in-memory circuitry enables a multiply-accumulate (MAC) operation based on shared charge. Row access circuitry drives multiple rows of a memory array to multiply a first data word with a second data word stored in the memory array in a bit-serial fashion. The row access circuitry drives the multiple rows based on the bit pattern of the first data word. Column access circuitry drives a column of the memory array when the rows are driven. Charge accumulates on the column line. Sensing circuitry can sense charge on the column line.

Accelerators based on compute-in-memory (CIM) circuits can perform operations such as dot-product and absolute difference of vectors locally within a memory without having to send data to the host processor. CIM accelerators targeted for various Deep-Learning applications perform MAC operations within the memory to enable higher throughput dot-product of neuron activation and weight matrices while still providing higher performance and lower energy compared to computation by a host processor.

The CIM circuit includes a local memory processor in the memory circuit to perform processing to return a computation result instead of returning data. In one example, a processor in the memory circuit computes a MAC value based on the charge sensed on the column. It will be noted that the abbreviation "MAC" can refer to multiply-accumulate, multiplication/accumulation, or multiplier accumulator, in general referring to an operation that include the multiplication of two values, and the accumulation of a sequence of multiplications. CIM circuitry reduces the amount of data transferred between memory and the compute engine, which can be a processor or arithmetic logic. The reduction in data movement accelerates the operation of algorithms that are memory bandwidth limited. The reduction in data movement also reduces energy consumption of overall data movement within the computing device.

In one example, the CIM circuity increases the throughput of MAC operations within the CIM array by implementing the multiplication operation on the wordlines in bit-serial fashion. In one example, the CIM circuitry increases the throughput of MAC operations by implementing the accumulate operation via charge-sharing on global shared bitlines.

In one example, the CIM circuitry increases the MAC throughput by accessing multiple words in parallel within a single read cycle. As such the circuitry can multiply with multiple input operands. In one example, CIM arrays are partitioned vertically with shared global bitlines per column. In one example, the CIM wordline activation performs bit-serial multiplication per row access, local bitlines perform current-summing per partition for a multibit functional-read, and global bitlines perform charge-sharing for accumulation of the partial sum per column. In one example, the CIM circuitry performs current-summing on local bitlines, and charge-sharing on global bitlines.

In one example, the processor in the memory device or memory block (the local memory processor) includes an analog processor block. In one example, the local memory processor shifts the partial sums by one bit, and the circuitry repeats the overall operation. In one example, after N clock cycles, where N is a number equal to the input operand bit-length. Thus, the circuitry can perform multibit multi-operand MAC operations per column. In one example, for K subarrays with C columns, each subarray accessing M bit words ($W_i$) per column, and an input vector $\{X_j\}$ of N bits each, the CIM circuitry performs operations to execute Equation (1) per column in N clock cycles, achieving C*K multiplications and K accumulations per cycle.

$$Y_{col} = \Sigma_{i,j} X_{j=0:K-1} * W_{i=0:C-1} \quad (1)$$

FIG. 1A is a block diagram of an example of a compute-in memory system that performs computations with current summing and charge sharing. System 100 represents an example of a compute-in memory (CIM) block or CIM circuitry. System 100 includes memory 110. Memory 110 represents a memory circuit, which includes memory array 120 made up of multiple bitcells 122. Array 120 can be any size of memory array. In one example, the number of bitcells per row is different than the number of bitcells per column.

Bitcell 122 is an example of a memory cell. The memory cell can be a bitcell in accordance with any of a variety of different technologies. The bitcells are at the intersection of a row with a column. In one example, bitcell 122 is a static random access memory (SRAM) cell. In one example, bitcell 122 represents a 6-transistor (6T) SRAM cell. In one example, bitcell 122 represents a, 8-transistor (8T) SRAM cell. In one example, bitcell 122 represents a 10-transistor (10T) SRAM cell. The bitcells can include more or fewer transistors other than what is specified here. In one example, bitcell 122 represents a memory cell based on a dynamic random access memory (DRAM) technology. In one example, bitcell 122 represents a memory cell in accordance with a resistive-based random access memory (RAM) cell. Resistive-based RAM can include resistive-RAM (Re-RAM), magnetoresistive RAM (MRAM), ferroelectric RAM (FeRAM), dielectric RAM, or other memory.

In one example, bitcell 122 is connected to differential bitlines or column lines. In one example, array 120 of memory 110 has single-ended bitlines. It will be understood that differential bitlines can improve the signal integrity of the sensing of the signal in the bitcells. In system 100, the bitline (BL) or column line is illustrated as BL, and the complementary signal by BL_b or bitline-bar.

Memory 110 includes row decoders 130 to drive rows of array 120. In one example, the rows are wordlines. Memory 110 includes precharge circuitry 140 to charge columns of array 120. In one example, the columns are bitlines. Row decoder 130 includes driver circuitry to apply charge to the rows. In one example, precharge circuitry 140 first charges the columns, and then row decoder 130 activates the rows for access, such as a read. As illustrated, in one example, row decoder 130 selects multiple rows simultaneously. Simultaneous selection refers to charging the rows together for a concurrent access to multiple rows. System 100 illustrates selected rows 132 as the rows charged together for concurrent access. The other rows of array 120 are non-selected rows 134. When multiple rows are selected together, the charge on the different rows combines to perform the equivalent of a multiplication of the values in the rows for a column with an input value.

In one example, memory 110 provides either traditional memory access (e.g., read and write of specific addresses), as well as CIM operation. In one example, the access control for memory 110 determines how to control decoder 130 and precharge circuitry 140 for the different types of operation. The access control refers to control circuitry in a processor or lower level memory circuit that accesses the memory for data. In one example, the processor can support a different instruction or control code to identify CIM operations. In one example, the processor specifically stores data in memory 110 instead of a lower level memory when the data will be used for CIM operations.

In a traditional memory access as opposed to a CIM operation, memory 110 includes precharge circuitry 140, multiplexers (muxes) 142, and sense amplifiers (amps) 144. Traditionally sense amplifiers 144 require so much physical space, multiple column lines are multiplexed together with a mux 142. The outputs of the sense amplifiers are again multiplexed for the bus to the processor circuitry or arithmetic logic unit (ALU) circuitry. The traditional memory access results in a read out of word (W). As illustrated in system 100, word W includes W[3:0]. With a traditional memory read, the stored data flows from memory array 120 to a digital processor for computation. The digital processor is a host processor that operates on digital data. Traditional memory access can refer to traditional von Neumann computing systems, which use a central processing unit (CPU) operating on data fetched from a memory unit. In one example, the digital processor is a graphics processor or graphics processing unit (GPU). In one example, the digital processor includes or is an ALU.

The traditional memory access approach does not perform well with data-intensive applications such as machine-learning (ML), which typically perform large amounts of data processing. The data is either stored on-chip in SRAM arrays or in off-chip DRAM memory. The system fetches the data from the memory to feed into the processor. The data for machine learning or deep learning is often referred to as weights. The digital host processor in an accelerator or host system performs operations such as matrix-matrix multiplication, vector-matrix multiplication, element-wise operations, absolute difference computation, or other computation.

For in-memory processing or compute in-memory (CIM), system 100 includes analog processor 150. In one example, analog processor 150 is part of memory 110. Analog processor 150 receives two inputs and performs one or more computations on the inputs. The inputs are W from the memory, and X to compute a function. Thus, analog processor 150 produces output OUT=f(X,W). The function can be matrix multiplication, absolute difference computation, dot product multiplication, or other ML operation.

CIM circuits can be part of a CIM accelerator to allow a digital processor to offload machine learning operations. CIM circuits can overcome the communication and bandwidth limitations of traditional processing by embedding compute operations within memory 110. In one example, the compute operations in array 120 are directly performed on a data read from memory 110 instead of transferring it to a digital processor. Performing the compute operations in array 120 essentially makes the BLs to act as interconnects between memory and the compute engine of analog processor 150. In one such example, the computations happen directly on the bitline voltage after the read operation that accesses bitcells 122 of selected rows 132.

The read operation in system 100 can be referred to as a functional read (FR), because a read of array 120 results in a functional output from analog processor 150. As illustrated, memory 110 stores data in column major format (see FIG. 4), as opposed to row major format (see FIG. 6). In one example, system 100 stores data in row major format, as explained in more detail below. In one example, system 100 activates multiple row or wordlines (WL) drivers at the same time to read a word of the column. In one example, to ensure that most significant bits (MSBs) have higher weight in column major format, system 100 enables the MSB row driver for a longer duration than the least significant bit, such as with pulse-width time modulation. In another example, instead of driving the row driver for a longer duration, the same behavior is achieved by using digital to analog converters (DACs) for row access with varying voltage levels for different bit positions, such as with voltage-amplitude modulation). In either case, system 100 accesses the word stored in column major format with bit position weighting.

In one example, prior to a read operation, system 100 precharges the columns in array 120 to the memory supply voltage (VDD). When system 100 activates multiple row drivers, the columns discharge to a voltage proportional to the values stored in the corresponding rows of the column. Weighting the rows by bit position weighted results in a column voltage drop ($\Delta V_{BL}$, or delta/change of bitline voltage) that is directly proportional to the binary stored word. For example, for the 4-bit word shown in system 100, assuming that $W_3$ is the MSB and $W_0$ is the LSB, the total current discharge and thus the voltage drop of the column is proportional to $\{W_0+2*W_1+4*W_2+8*W_3\}$.

In one example, analog processor 150 capture the $\Delta V_{BL}$ on a sampling capacitance. In one example, system 100 does not have capacitors for analog processor 150 to perform the sensing, as memory 110 can perform the operation based on the capacitance of the bitline itself. In one example, analog processor 150 includes analog compute blocks with bitline processors (BLPs) and cross bitline processors (CBLPs). In one example, the sampling capacitances are fed directly into the BLPs and CBLPs to perform unit machine learning operations based on charge sharing operations. In one such example, the BLP performs an elementwise multiplication of input X and the output of functional read W=$\Delta V_{BL}$(W[3:0]), which in turn produces a voltage corresponding to the multiplication of X*W. In one example, the CBLP accumulates the voltages from multiple BLPs and produces a single output voltage, which corresponds to an accumulation operation in a digital processor equal to $\Sigma Xi*Wi$, which can be referred to as a functional output. Thus, memory 110 can perform a MAC operation in memory array 120 with analog processor 150 to perform one or more operations, such as shift operations, to complete the functional output.

In accordance with the foregoing, system 100 performs a high throughput MAC operation for inputs X and weights W in memory 110 with CIM hardware, as opposed to a compute block outside of the memory with a more limited bandwidth. Details of the analog processors BLP and CBLP are beyond the scope of description here, as they can be implemented in any number of different ways.

It will be understood that there is a heavy design effort to activate multiple rows on a single column. The traditional computations require the analog processor to resolve the bitline voltage, and thus activation of multiple rows increases the resolution required by the analog processor. In contrast to traditional approaches that required sampling with limited voltage headroom, and so required high resolution for reading the bitline voltages, one example of system 100 maps the multiply operation from analog processor 150 to the activation of the WL itself, and maps the charge sharing onto a shared bitline. In one example, system 100 maps a multiply operation onto a wordline and functional read operation onto a local bitline, with charge sharing mapped onto a global or shared bitline.

Figure 1B:
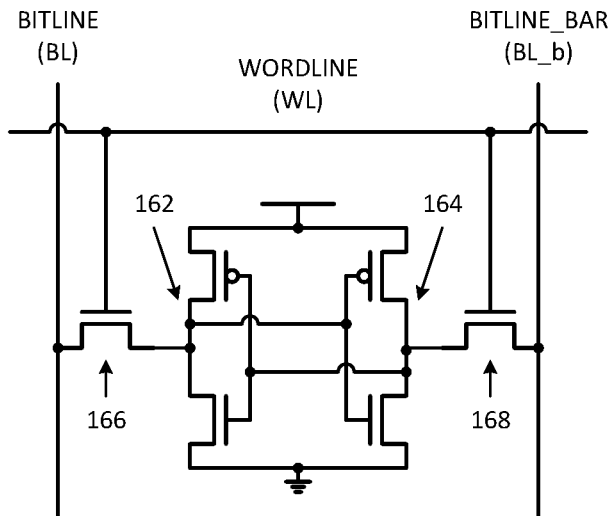
FIG. 1B is a block diagram of an example of a six transistor (6T) bitcell for a compute-in memory circuit that performs computations with current summing and charge sharing.

FIG. 1B is a block diagram of an example of a six transistor (6T) bitcell for a compute-in memory circuit that performs computations with current summing and charge sharing. Circuit 122A represents a 6T bitcell example of bitcell 122 of system 100. The bitcell can alternatively be referred to as a storage cell. The transistors of circuit 122A can be metal oxide semiconductor field effect transistors (MOSFETs) or other type of transistor. Transistors 166 and 168 represent access transistors that control access to circuit 122A during read and write operations.

The access transistors are turned on whenever a wordline (WL) is activated for read or write operation, connecting the storage cell to the complementary bitlines (BL, BL_b). When the wordline is not activated, access transistors 166 and 168 are turned off and the data is retained in the storage cell while power is applied to circuit 122A. An example of circuit 122A includes cross-coupled inverters. Inverters 162 and 164 are cross-coupled inverters to form a latch that stores or holds a bit value as long as a the bitcell is powered. Each inverter includes a PMOS (P-channel MOSFET) transistor coupled to VDD, and an NMOS (N-channel MOSFET) transistor coupled to ground.

The gates of inverter 162 are controlled by transistor 168, and are thus driven when transistor 168 is on (which is driven by the WL), and which are coupled to the output of inverter 164. The gates of inverter 164 are controlled by the state of transistor 166, and which in turn are coupled to the output of inverter 162. The storage cell has two stable states which are used to store a logic 0 or logic 1. When the access transistors are on the gates of the inverters are controlled by the bit value on the bitlines. When the access transistors are off, the inverters each drive the other to hold its value.

Circuit 122A provides one example of a 6T SRAM for a global charge-sharing CIM circuit. In one example of a CIM circuit, a sense amplifier (not shown) coupled to the bitcell converts the local bitline voltage to a full-swing signal. A global charge-sharing technique for a CIM circuit can increase the MAC throughput, with multiply operations performed in bit-serial fashion. A 6T bitcell is compatible with a memory array for a MAC operation in accordance with any example described.

Figure 1C:
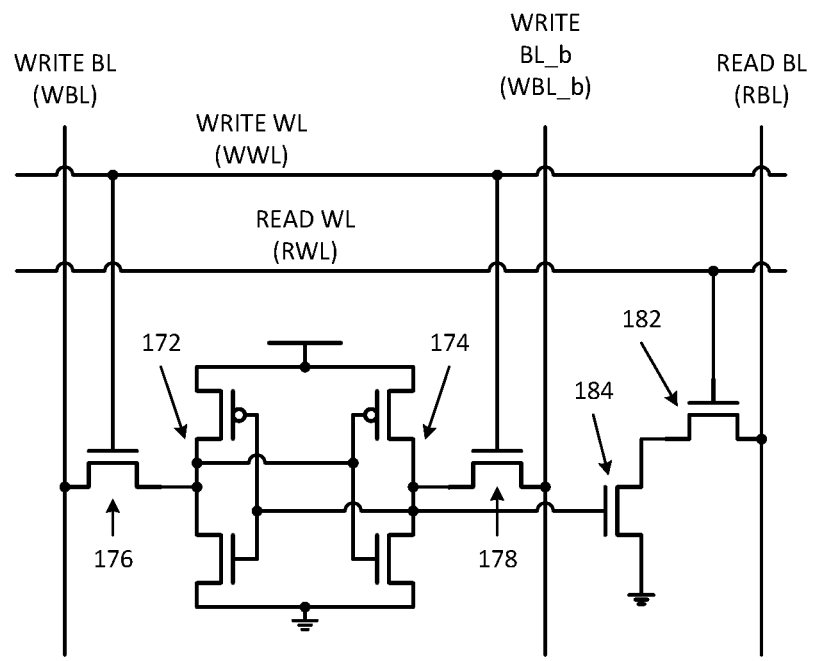
FIG. 1C is a block diagram of an example of a six transistor (8T) bitcell for a compute-in memory circuit that performs computations with current summing and charge sharing.

FIG. 1C is a block diagram of an example of a six transistor (8T) bitcell for a compute-in memory circuit that performs computations with current summing and charge sharing. Circuit 122B represents an 8T bitcell or storage cell example of bitcell 122 of system 100. The transistors of circuit 122B can be MOSFETs or other type of transistor. Transistors 176 and 178 represent access transistors that control access to circuit 122B during read and write operations.

The access transistors are turned on whenever a write wordline (WWL) is activated for a write operation, connecting the storage cell to the complementary write bitlines (WBL, WBL_b). When the write wordline is not activated, access transistors 176 and 178 are turned off and the data is retained in the storage cell while power is applied to circuit 122B. An example of circuit 122B includes cross-coupled inverters to form a latch. Inverters 172 and 144 are cross-coupled inverters to form a latch that stores or holds a bit value as long as a the bitcell is powered. Each inverter includes a PMOS transistor coupled to VDD, and an NMOS transistor coupled to ground.

The gates of inverter 172 are controlled by transistor 178, and are thus driven when transistor 178 is on (which is driven by the WL), and which are coupled to the output of inverter 174. The gates of inverter 174 are controlled by the state of transistor 176, and which in turn are coupled to the output of inverter 172. The storage cell has two stable states which are used to store a logic 0 or logic 1. When the access transistors are on the gates of the inverters are controlled by the bit value on the bitlines. When the access transistors are off, the inverters each drive the other to hold its value.

Circuit 122B also includes transistor 182 whose gate is connected to the read wordline (RWL). Thus, transistor 182 is an access transistor for a read operation. Transistor 184 is coupled between transistor 182 and ground, with its gate controlled by the state of transistor 178 and thus the value on WBL_b. Transistor 182 pulls read BL (RBL) to the voltage level of transistor 184 when RWL is asserted. Transistor 184 will pull RBL to ground when its gate is asserted (e.g., the inverted output is 1) or will remain high when the inverted output is 0.

Circuit 122B provides one example of a 8T SRAM for a global charge-sharing CIM circuit. In one example of a CIM circuit, an element not specifically shown such as a sense amplifier, a skewed inverter, or a skewed buffer coupled to the bitcell converts the local bitline voltage to a full-swing signal. A global charge-sharing technique for a CIM circuit can increase the MAC throughput, with multiply operations performed in bit-serial fashion. A 6T bitcell is compatible with a memory array for a MAC operation in accordance with any example described. While an 8T bitcell is illustrated by circuit 122A and an 8T bitcell is illustrated by circuit 122B, it will be understood that different architectures can be used, such as a 10T bitcell where two more transistors and another bit line are added to provide a differential read output.

Figure 2:
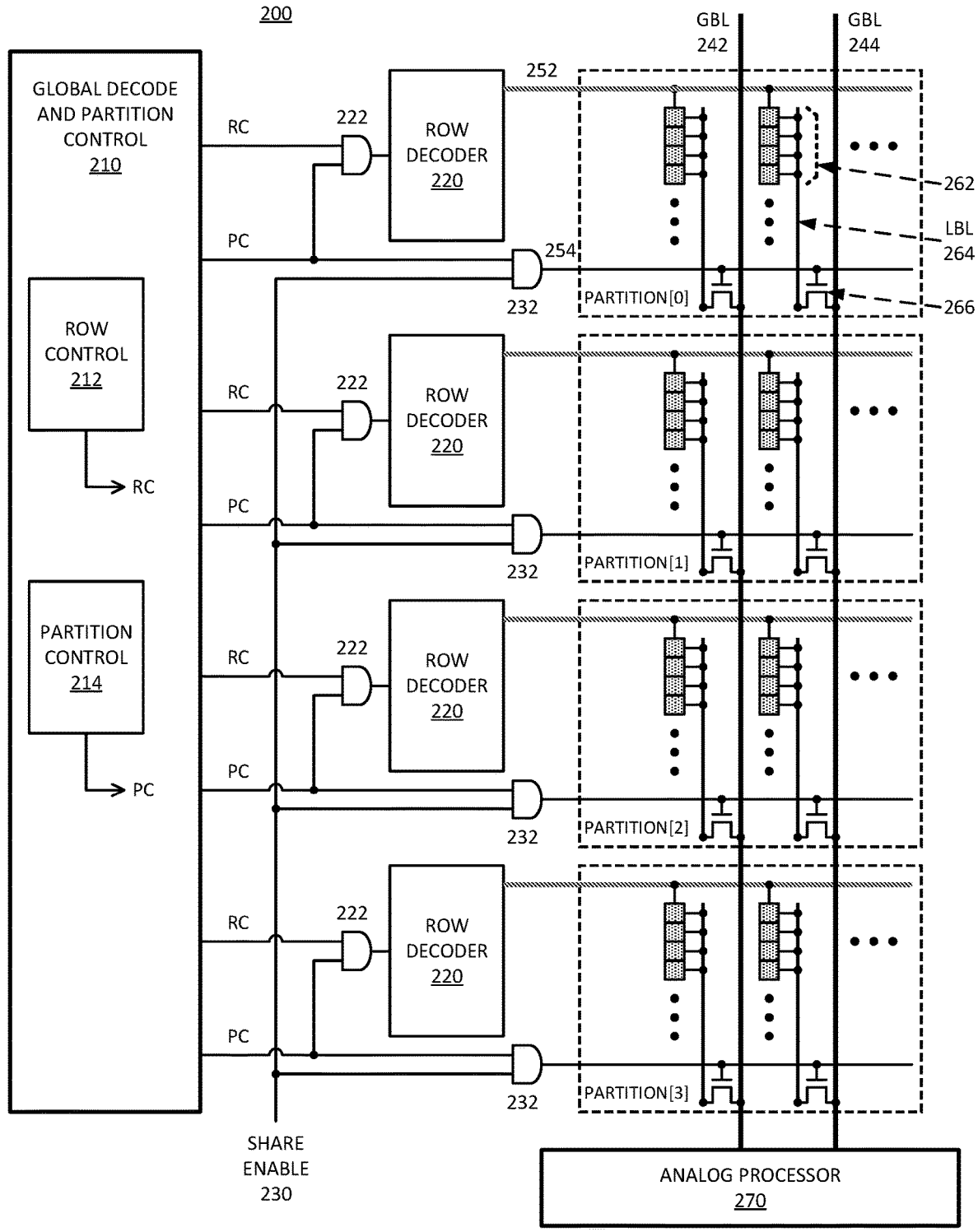
FIG. 2 is a block diagram of an example of a compute-in memory circuit that performs global charge sharing.

FIG. 2 is a block diagram of an example of a compute-in memory circuit that performs global charge sharing. System 200 provides an example of a CIM circuit in accordance with system 100 of FIG. 1. System 200 includes a memory array, which is not specifically identified, but includes rows and columns of storage cells or bitcells. In one example, the memory array is partitioned. System 200 represents four partitions, Partition[3:0], but it will be understood that more or fewer partitions can be used. Partitioning the memory array into multiple subarrays allows control over rows or wordlines by local row decoders, which can access multiple rows simultaneously per subarray.

Row decoders 220 represent the local row decoders, with one row decoder 220 per partition. In one example, system 200 includes global decode and partition control 210. Control 210 provides logic devices and circuitry to resolve memory access requests to a specific subarray, or a specific partition as illustrated. In one example, control 210 provides control signals to control row decoders 220 and access to the partitions. In one example, control 210 includes row control 212, which represents logic to generate a row control signal. The row control signal is abbreviated in system 200 as "RC", and control 210 sends appropriate row control signals to the respective row decoders 220 of the various partitions. In one example, control 210 includes one-hot partition control 214, which could alternatively be referred to simply as "partition control". Partition control 214 represents logic to generate a partition control signal to select a partition, where the selected partition can be referred to as the "turned-on partition", being the partition to be accessed. The partition control signal is designated as "PC" (for "partition-control") in system 200. In one example, the PC signal can select multiple partitions at the same time to be accessed.

In one example, system 200 controls the row access with the PC signal. The PC signal can activate all or a selected/chosen subset of the subarrays simultaneously. Activating multiple subarrays simultaneously provides a tradeoff in between maximum throughput (e.g., by performing a functional read operation on words stored in multiple different partitions) and the energy required to perform the functional read operation. It will be understood that deactivated subarrays do not discharge their local bitlines (LBLs), and thus do not consume dynamic read energy.

In one example, system 200 also controls the row access with the RC signal, which selects the specific rows to be accessed. As illustrated, the PC signal can be ANDed with the RC signal with AND gates 222 to provide the row address information to row decoder 220 only when the partition for the row decoder is selected. System 200 only illustrates a single row line coming from row decoder 220 into the partitions, but the line represents one or more selected rows or WLs per partition. The partitions illustrate multiple bits or storage cells coupled to the wordline. The diagram can be understood to represent either column major formatting or row major formatting. With column major formatting, it will be understood that row decoder 220 can activate multiple rows per partition. With row major formatting, multiple BLs can be precharged to be accessed when the WL is activated. Storage cells are accessed by the combination of row and column access control.

In one example, system 200 includes both local column lines or local BLs (LBLs) 264 as well as global column line or global BLs (GBLs). LBLs are local to a partition, and GBLs connect multiple LBLs to analog processor 270. In one example, LBLs connect to only a partition of rows of the memory array, or only to a portion of the memory array. In one example, GBLs connect LBLs together for a column address to be accessed by the processing resources.

In one example, LBLs and GBLs are precharged before a functional-read, and LBLs are connected to a shared GBL per column. In one example, system 200 includes switches in the partitions to couple respective LBLs to associated GBLs. For example, Partition[0] includes switch 266 to couple LBL 264 to GBL 244 to perform a functional read of the data of storage cells 262. In one example for storage cells 262, system 200 performs multibit current summing per column. For purposes of illustration, GBL 242 is also illustrated, which connects to other LBLs for access to other bits. It will be observed that GBL 242 connects LBLs of the partitions to analog processor 270, and GBL 244 connects other LBLs of the partitions to analog processor 270.

Consider the example further of Partition[0]. The output of row decoder 220 associated with Partition[0] is labeled as signal line 252, which represents one or more WLs for the partition. In one example, system 200 includes AND gates 232 to AND the PC signal with a signal Share Enable 230. Share Enable 230 can control the operation of switch 266 for a selected partition. For a partition selected by the PC signal, and with sharing enabled by Share Enable 230, signal 254 from AND gate 232 turns switch 266 on, connecting LBL 264 to GBL 244. Share Enable 230 provides control over the connection of the LBLs to the GBLs to enable charge-sharing of LBLs on the GBLs. In one example, control 210 disables the WLs (via the RC signal) and enables Share Enable 230 to activate LBL to GBL connections.

Thus, system 200 has timing control over the functional read operations. As such, system 200 can compute the timing to make the connection of the LBLs to the GBLs for different operations. For example, for multi-row access, simultaneous access to two rows may take less time than simultaneous access to four rows to allow the current sharing to occur. Control 210 represents host system control that can make determinations of the timing control to be used to effectuate the operations, such as MAC operations. After allowing sufficient time for current summing on the LBLs controlled by WLs, control 210 can issue Share Enable 230 to cause connection of the LBLs to the GBLs to trigger charge sharing on the GBLs. In one example, control 210 uses the same PC signal to control the LBL to GBL connect switches.

In one example, at the end of a functional read operation, analog processor 270 samples the GBL voltages and performs one or more shift operations to complete the computation. In one example, after operation by analog processor 270, control 210 precharges the LBLs and GBLs to a VDD value for the memory array and de-asserts Share Enable 230. In one example, after a number of functional read cycles equal to a bit length of input vectors, analog processor 270 finalizes a high throughput MAC operation by a final addition per column. It will be understood that the number of partitions and the number of rows accessed per subarray are design choices that depend on hardware throughput specifications. System 200 can be designed in accordance with different throughput specifications. Thus, system 200 supports different configurations for different MAC throughputs, based on system design.

Thus, system 200 can include partitioning based on the memory architecture and how the system is configured to perform machine learning operations. It will be understood that system 200 enables performing various computations in the memory resources instead of operations that would traditionally be executed by a host processor (not specifically shown), or by analog processor 270. In one example, system 200 maps multiply operations from analog processor 270 to activation of the WL itself. In one example, the CIM resources can accomplish one-bit multiply operations on a number of partitions. In one example, system 200 enables current summing to implement a multiply with a multibit value function, and charge sharing to implement an accumulate function.

In one example, analog processor 270 has minimized area and power cost relative to an analog processor for CIM circuitry that is not partitioned. For example, partitioning can select specific resources for access, which can allow the use of only a single analog processing block for sampling GBLs for the overall CIM block, instead of one analog processing block for each subarray. In one example, partitioning enables operating on multiple words concurrently.

Figure 3:
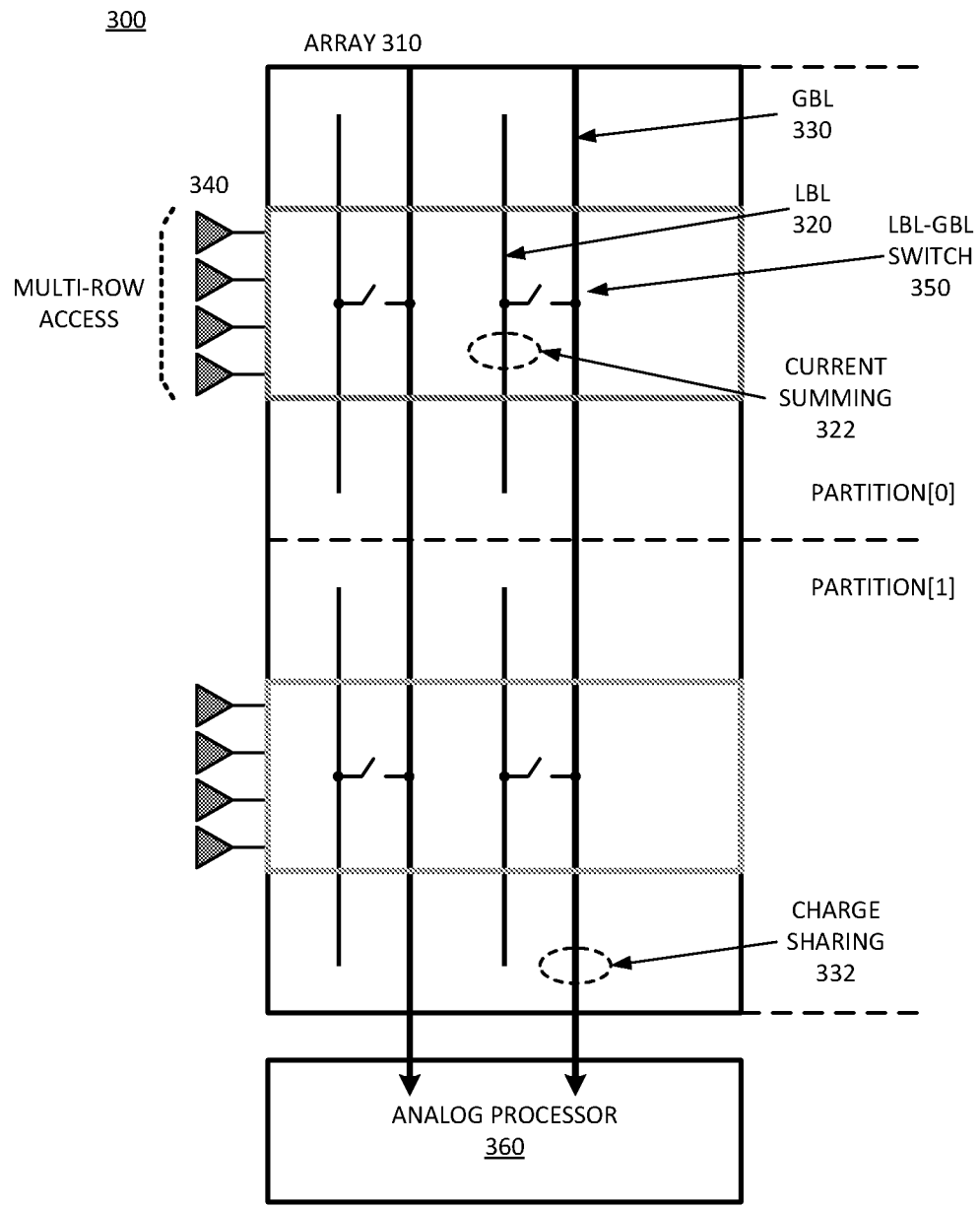
FIG. 3 is a block diagram of an example of a compute-in memory circuit that performs global charge sharing for multi-row access.

FIG. 3 is a block diagram of an example of a compute-in memory circuit that performs global charge sharing for multi-row access. System 300 represents CIM components in accordance with an example of system 100 of FIG. 1, or system 200 of FIG. 2. More specifically, system 300 provides an example of a partitioned CIM block with hierarchical global charge sharing bitlines.

In one example of a CIM block with column-major storage format, the system accesses multiple rows in a bit-positioned manner and performs current-summing on BLs to read multibit values per column. System 300 includes array 310, which represents a memory array or a CIM array. In one example, system 300 provides control signals from control hardware (not specifically shown) to perform multi-row access 340. With multi-row access 340, system 300 can access multiple rows per partition (e.g., as shown system 300 can access four rows in Partition[0] and four rows in Partition[1]). The row access can perform bit-serial multiplication per partition, with LBL 320 performing current summing, and GBL 330 performing charge-sharing and accumulation of the partial sum. LBL-GBL switch 350 represents a switch to selectively connect the local column circuitry and local column line to the global column circuitry including the column line. In one example, when the voltage is ready on LBL 320, for example, after a sufficient settling time after the discharging and access, system 300 triggers switch 350 to connect LBL 320 to GBL 330.

In one example, system 300 performs multiplication with an operand X at analog processor 360. In one example, the multiplication operation is performed in a bit-serial fashion, where one-bit multiplication is mapped to an AND operation of the WL and one-bit input. In one example, to perform multiple bit-serial multiplications at the same functional read cycle, the CIM block of array 310 is partitioned into subarrays identified as Partition[0] and Partition[1].

In one example, the operation of system 300 is in accordance with the following. System 300 activates multirow access 340 when an input word X operand bit is 1, otherwise it is deactivated. As such, the activation can perform the equivalent of a multiply operation, with a multiply by 1 when the bit is a 1, and a multiply by 0 by deactivating the WL when the bit is a 0. In such an implementation the WL access can inherently perform single bit multiplication. In one example, system 300 reads multiple bits per column via current summing on the precharged LBLs (such as LBL 320) by using bit-positioned pulse width modulation (PWM) on the WLs. For example, at LBL 320, array 310 provides multibit current summing at 322. In another example, at GBL 330, array 310 provides charge sharing 332.

Whether with PWM or some other operation that enables multibit read per column, system 300 connects LBLs to a shared and precharged GBL (such as GBL 330) through switches 350. In one example, switches 350 are CMOS pass gates. In one example, switches 350 are implemented as CMOS transmission gates. In one example, system 300 activates switches 350 simultaneously with deactivating the WLs, which results in a charge sharing operation on the GBLs, such as GBL 330. In one example, the charge sharing operation performs the addition operation for partial sum Y_psum=a*X0[i]+b*X1[i] for a given bit position i in the loop, per column. In one example, analog processor 360 performs shift and add operations across columns. Thus, for a bit length of input X vector N, system 300 can perform high throughput MAC operation within the CIM array in N functional-read clock cycles.

Figure 4:
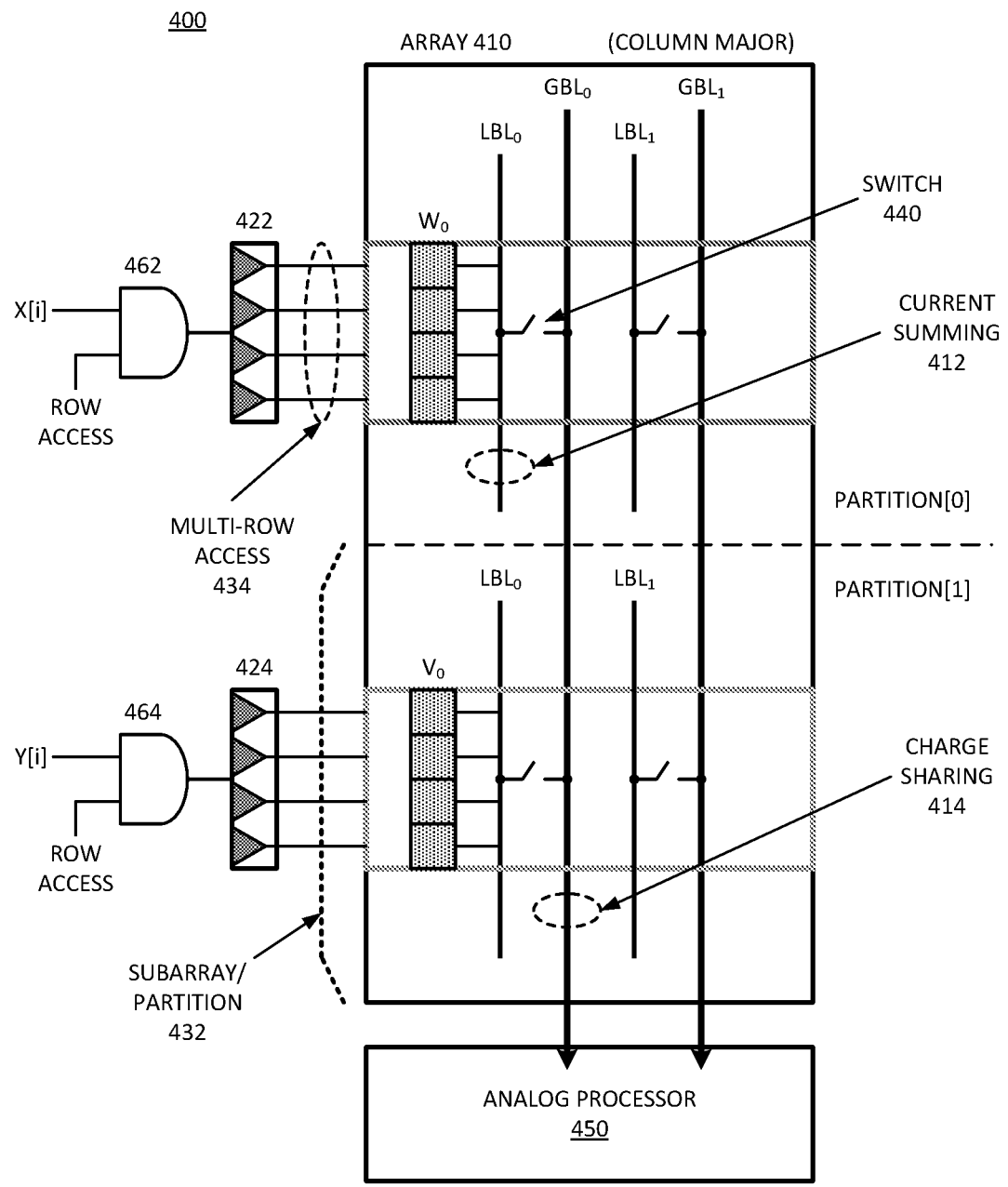
FIG. 4 is a block diagram of an example of a compute-in memory circuit that performs global charge sharing for multi-row access with a column major memory array.

FIG. 4 is a block diagram of an example of a compute-in memory circuit that performs global charge sharing for multi-row access with a column major memory array. System 400 represents a CIM block in accordance with an example of system 300 of FIG. 3. System 400 provides an example of a partitioned CIM block with hierarchical global charge sharing bitlines with data stored in column major format.

System 400 includes array 410 with data stored in column major format. In column major format, the consecutive bits of a word are stored at the same column address in different rows. In contrast, data in row major format has the consecutive bits of the word stored at the same row address in different columns.

Consider that each column stores N words. In one example, N=1 and a column stores a single word. In one example, N is greater than 1 and a column stores multiple words. It will be understood that in a computation on a word, the access control circuitry can access multiple WLs concurrently without accessing all bits of the word. Thus, computation on an entire word can include multiple operations involving the consecutive access of multiple rows in sequence until the computation is performed on the entire word. In one example, a word can be split to have portions stored in different partitions, and thus a word is not necessarily stored as a contiguous sequence of bits.

In one example, system 400 accesses multiple rows in a bit-positioned manner and performs current summing on BLs to read multibit values per column. System 400 includes array 410, which represents a CIM array. System 400 includes decoder hardware 422 for Partition[0] and decoder hardware 424 for Partition[1]. The dashed line pointed to by 432 illustrates a subarray or partition of array 410. In one example, for both Partition[0] and Partition[1], the control hardware of system 400 performs multi-row access 434. In one example, system 400 includes AND gate 462 to AND bits of word X[i] with a row access signal (such as the Row Control signal of system 300) to select the multiple rows of Partition[0] for the CIM operation. In one example, system 400 includes AND gate 464 to AND bits of word Y[i] with a row access signal (such as the Row Control signal of system 300) to select the multiple rows of Partition[1] for the CIM operation.

Partition[0] includes $LBL_0$ and $LBL_1$, which represent local BLs that are local to Partition[0]. Partition[1] also includes $LBL_0$ and $LBL_1$, which represent local BLs that are local to Partition[1]. Although they are labeled the same, it will be understood that the local bitlines are local to a specific partition, and do not extend to the other partition. $LBL_0$ and $LBL_1$ (for both partitions) are selectively connectable to $GBL_0$ and $GBL_1$, respectively. The LBLs are selectively connected to the GBLs through switches 440. In one example, the LBLs enable current summing 412, as shown on $LBL_0$ of Partition[0]. In one example, the GBLs enable charge sharing 414, as shown on $GBL_0$.

In one example, system 400 accesses multiple rows in a bit-position weighted manner via local decoders per subarray (e.g., decoder 422 of Partition[0] and decoder 424 of Partition[1]). In one example, the local decoders are AND gated with the input operand vector bit (depicted as {X,Y} in system 400) to perform bit-serial multiplication with word W in Partition[0] and with word V in Partition[1], respectively. Bit serial multiplication can refer to driving the same bit of the operand vector on the multiple rows. In one example, each bit is binary weighted in accordance with the bit position of the row being driven. In one example, system 400 performs current summing 412 per subarray on the precharged LBLs, resulting in multiplication of the input vector bit and multibit functional read of a word, per subarray column. Switches 440 can selectively connect multiple LBLs to a shared and precharged GBL. In one example, when current summing is completed, by allowing sufficient time to have the voltage reach its voltage drop level AV for the read, system 400 deactivates the WLs and activates the global connection switches, connecting each LBL to the shared GBL per column.

In one example, after deactivating the WLs and connecting the LBLs to the GBL, the charge sharing operation on the GBLs results in a voltage on the GBL per column proportional to the resulting accumulation operation for a given bit position. In one example, analog processor 450 samples the GBLs after the functional read cycle is done. In one example, analog processor 450 performs one or more shift operations on data derived from the BLs. In one example, system 400 precharges all BLs again for the next functional read cycle.

In one example, for a given bit position i, the following are true: At Partition[0]:

$$\Delta V\_LBL_0 \sim X[i] \cdot W_0.$$

At Partition[1]:

$$\Delta V\_LBL_0 \sim Y[i] \cdot V_0.$$

Thus, for the two partitions, the voltage change on the LBL is proportional to the intersection of the operand vector bit value with the value of the bit stored in the storage cell. In one example, the value is further multiplied for relative position of the word by causing a multiplied charge for respective higher-order bits. Shifting to the left at the end of every functional-read enables multiplying the next higher bit position by 2, the next higher bit position by 4, and so forth. Charge-sharing the LBLs on the GBL results in a voltage proportional to the accumulation of all the LBLs voltages, with the pre-condition that LBL and GBL capacitances are known. In total, at the global level:

$$\Delta V\_GBL_0 \sim X[i] \cdot W_0 + Y[i] \cdot V_0.$$

Figure 5:
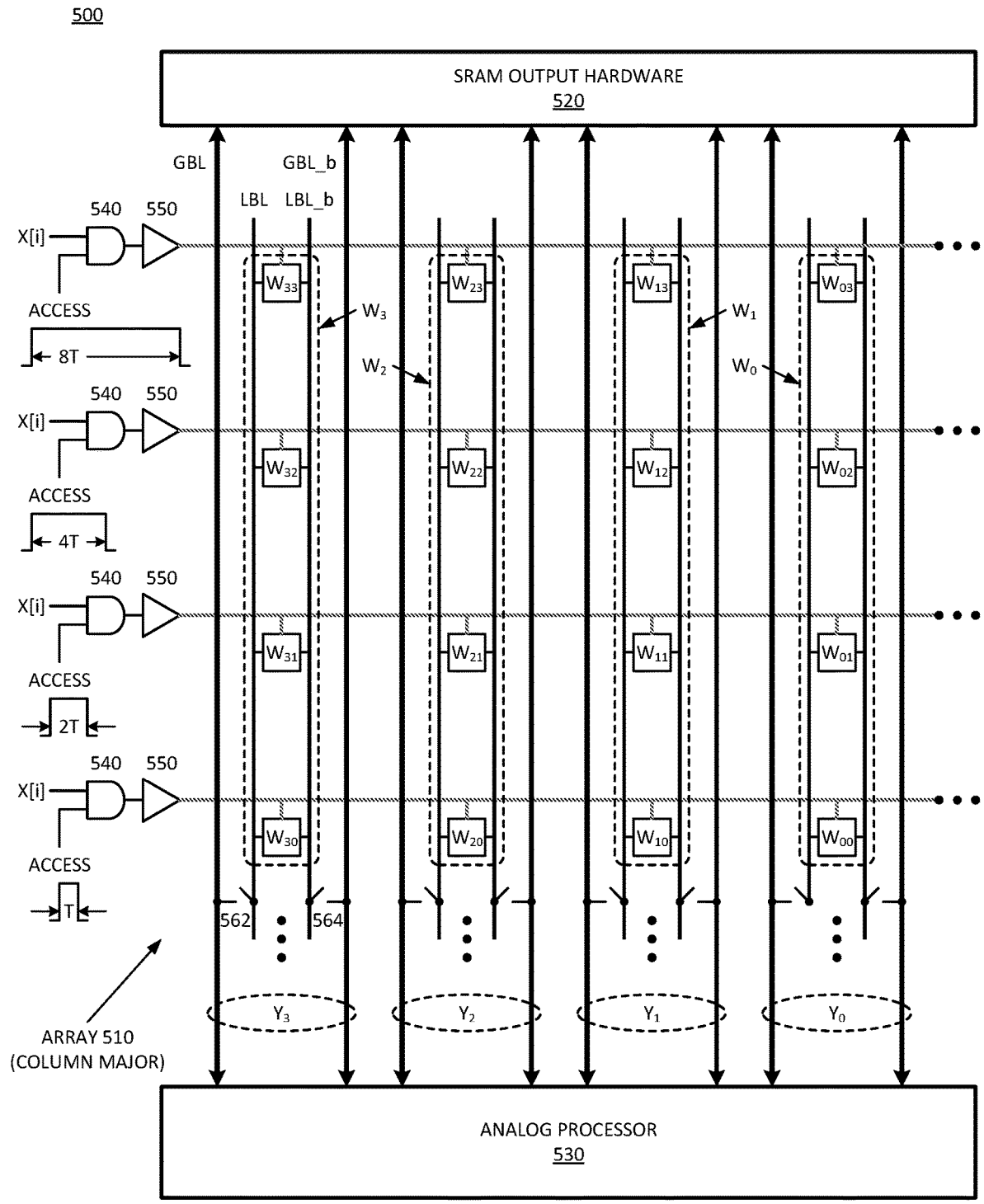
FIG. 5 is a block diagram of an example of a compute-in memory circuit that performs global charge sharing for multi-row access with a column major memory array and a differential bitline.

FIG. 5 is a block diagram of an example of a compute-in memory circuit that performs global charge sharing for multi-row access with a column major memory array and a differential bitline. System 500 is an example of a CIM array in accordance with an embodiment of system 400 of FIG. 4. System 500 illustrates elements of a memory array 510 with CIM circuitry, and it will be understood that the memory array includes more elements than what are shown. In one example, memory array 510 is an SRAM array.

System 500 includes SRAM output hardware 520, which represents hardware to precharge and sense the bitline bit values and provide a data read output. While the local bitlines are not explicitly illustrated as being connected to hardware 520, it will be understood that the bitlines are connected to circuitry to precharge the lines in preparation for a read. System 500 illustrates driver circuitry 550 to drive the wordlines, and AND gates 540 to selectively drive the WLs based on the operand vector X[i] and an access signal (Access).

The data is stored in array 510 in column major format. For system 500, assume that the MSB is the topmost WL, and the LSB is the bottommost WL. Also, the leftmost column is the most significant column, and the rightmost column is the least significant column. The reference numbers of the bit positions are to be understood as relative to each other and are not absolute positions. Thus, the leftmost column illustrated includes data word $W_3$, with bits [3:0] from top to bottom. For example, $W_3$ bit 3 is represented as $W_{33}$. The next column is $W_2$, then $W_1$, and finally $W_0$. Four columns are illustrated, but it is simply a representation and is not limiting or an indication of number of words or word size. The number of words and the length of the words can be different depending on the array size and system configuration.

In one example, array 510 includes differential bitlines. In one example, differential GBLs have corresponding differential LBLs. Thus, for example, the leftmost column illustrates LBL and LBL_b (the complement), selectively connected, respectively, to GBL and GBL_b. Switch 562 can selectively connect LBL to GBL, and switch 564 can selectively connect LBL_b to GBL_b. It will be understood that a differential bitline architecture can improve the ability of analog processor 530 to read or sense the bit value of the storage cells that make up array 510, given that the sensing can be performed as a comparison of the two lines that reduces the effects of noise. It will be understood that with a differential bitline, the storage cell will discharge to one bitline or the other depending on what is stored in the cell.

In one example, the access pulse is binarily weighted based on bit position within the word. For example, consider a read of $W_3$. In one example, system 500 drives $X_0$ to bit $W_3[0]$ for a time period T, drives $X_0$ to bit $W_3[1]$ for a time period 2T, drives $X_0$ to bit $W_3[2]$ for a time period 4T, and drives $X_0$ to bit $W_3[3]$ for a time period 8T. By driving a WL for a longer period of time, a greater amount of current discharges the local BLs for the higher order bits. Thus, the displaced charge will reflect the fact that a bit on the higher bi position WL is multiplied by a factor to indicate its position. The bottom of the bitlines illustrate voltage differentials Y[3:0] corresponding to words W[3:0]. Thus, $Y_3$ represents a voltage difference on GBLs for word $W_3$, $Y_2$ for $W_2$, and so forth. Analog processor 530 performs final computations on Y to reach a final computation for the functional output.

In one example, computation on a word includes multiple multi-row accesses. In one example, each multi-row access is performed with binary weighting of rows relative to each other, but not with an absolute weighting of the row in the word. For example, assume that the bits accessed from the storage cells illustrated in array 510 are four bits of a word that includes more than 4 bits. In one example, the bits are accessed as shown, with the relative binary weightings as shown. A subsequent access of additional bits of the word can be performed in the same manner with the same binary weighting of the words, and analog processor 530 keeps track of the absolute position of the bits. Thus, analog processor 530 can shift partial results to align the partial result to its place in the overall word computation. It will be appreciated that analog processor 530 can also handle bit carry-over from one partial result to another if needed.

Figure 6:
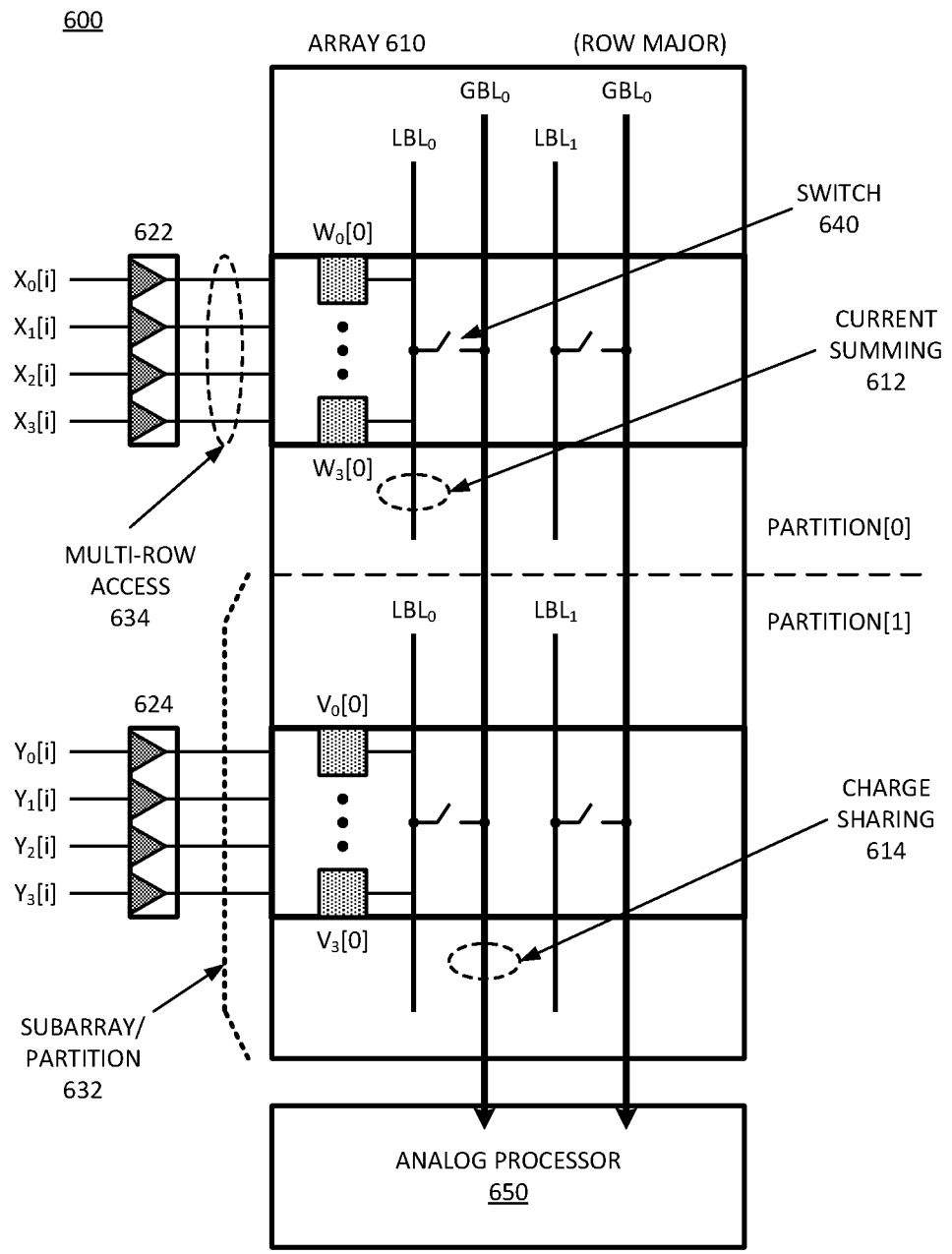
FIG. 6 is a block diagram of an example of a compute-in memory circuit that performs global charge sharing for multi-row access with a row major memory array.

FIG. 6 is a block diagram of an example of a compute-in memory circuit that performs global charge sharing for multi-row access with a row major memory array. System 600 represents a CIM block in accordance with an example of system 300 of FIG. 3. System 600 provides an example of a partitioned CIM block with hierarchical global charge sharing bitlines with data stored in row major format.

System 600 includes array 610 with data stored in row major format. In row major format, the consecutive bits of a data word are stored at the same row address in different columns. In contrast, in column major format, the consecutive bits of a word are stored at the same column address in different rows.

Consider that each row stores N words. In one example, N=1 and a row stores a single word. In one example, N is greater than 1 and a row stores multiple words. In accordance with what is described, a computation with a CIM array can include multi-row access where multiple WLs are accessed simultaneously. In one example, the system can perform multi-row access and perform operations on different words concurrently. It will be understood that the computations can include access to sequences of columns to access the consecutive bits of the different words of the multiple rows concurrently.

In one example, system 600 accesses multiple rows. System 600 includes array 610, which represents a CIM array. System 600 includes decoder hardware 622 for Partition[0] and decoder hardware 624 for Partition[1]. The dashed line pointed to by 632 illustrates a subarray or partition of array 610. In one example, for both Partition[0] and Partition[1], the control hardware of system 600 performs multi-row access 634. In one example, system 600 provides bits of different words $X_N[i]$ to different rows of the multi-row access.

Thus, in one example in row major format, system 600 maps each WL access to a single input X bit being multiplied with L entries per row, where L is the length of the word. System 600 can perform multi-row access 634 via local decoders 622 and 624 per subarray. In one example, row or WL is activated or deactivated by bits of respective input vectors to perform bit-serial multiplication per row (depicted as $\{X_N i, Y_N i\}$ in system 600). System 600 illustrates that the top row of Partition[0] stores word $W_0$, down to the bottom row storing word $W_3$, corresponding with input vectors X[3:0]. For Partition[1] the top row stores word $V_0$, down to the bottom row storing word $V_3$, corresponding with input vectors Y[3:0].

Partition[0] includes $LBL_0$ and $LBL_1$, which represent local BLs that are local to Partition[0]. Partition[1] also includes $LBL_0$ and $LBL_1$, which represent local BLs that are local to Partition[1]. Although they are labeled the same, it will be understood that the local bitlines are local to a specific partition, and do not extend to the other partition. $LBL_0$ and $LBL_1$ (for both partitions) are selectively connectable to $GBL_0$ and $GBL_1$, respectively. The LBLs are selectively connected to the GBLs through switches 640. In one example, system 600 performs bit serial multiplication with words W[3:0] in Partition[0] and with words V[3:0] in Partition[1], respectively. Bit serial multiplication can refer to driving the corresponding bits of the operand vectors on the multiple rows.

In one example, the LBLs enable current summing 612, as shown on $LBL_0$ of Partition[0]. In one example, the GBLs enable charge sharing 614, as shown on $GBL_0$. It will be understood that current summing and charge sharing can be performed in the CIM array of system 600 similar to the CIM array of system 400 of FIG. 4. In one example, a difference with the row major format of system 600 is that both LBLs and GBLs perform partial sum addition. Once the functional read cycle is done, analog processor 650 samples the GBLs and performs operations to complete the computation, such as shift operations.

Thus, in one example, after deactivating the WLs and connecting the LBLs to the GBL, the charge sharing operation on the GBLs results in a voltage on the GBL per column proportional to the resulting accumulation operation for a given bit position. In one example, analog processor 650 samples the GBLs after the functional read cycle is done. In one example, analog processor 650 performs one or more shift operations on data derived from the BLs. In one example, system 600 precharges all BLs again for the next functional read cycle.

In one example, for a given bit position i, the following are true: At Partition[0]:

$$\Delta V\_LBL_0 \sim \sum_{j=0}^{3} X_j[i] \cdot W_j[0].$$

At Partition[1]:

$$\Delta V\_LBL_0 \sim \sum_{j=0}^{3} Y_j[i] \cdot V_j[0].$$

Thus, for the two partitions, the voltage change on the LBL is proportional to the sum of the intersections of the operand vector bit values with the values of the bits stored in the storage cells. In total, at the global level:

$$\Delta V\_GBL_0 \sim \sum_{j=0}^{3} (X_j[i] \cdot W_j[0] + Y_j[i] \cdot V_j[0]).$$

Analog processor 650 can be configured to understand these relationships of the charges and perform operations to perform the final computation for the functional read output. It will be appreciated that analog processor 650 can also handle bit carry-over from multiple partial results to another if needed.

Figure 7:
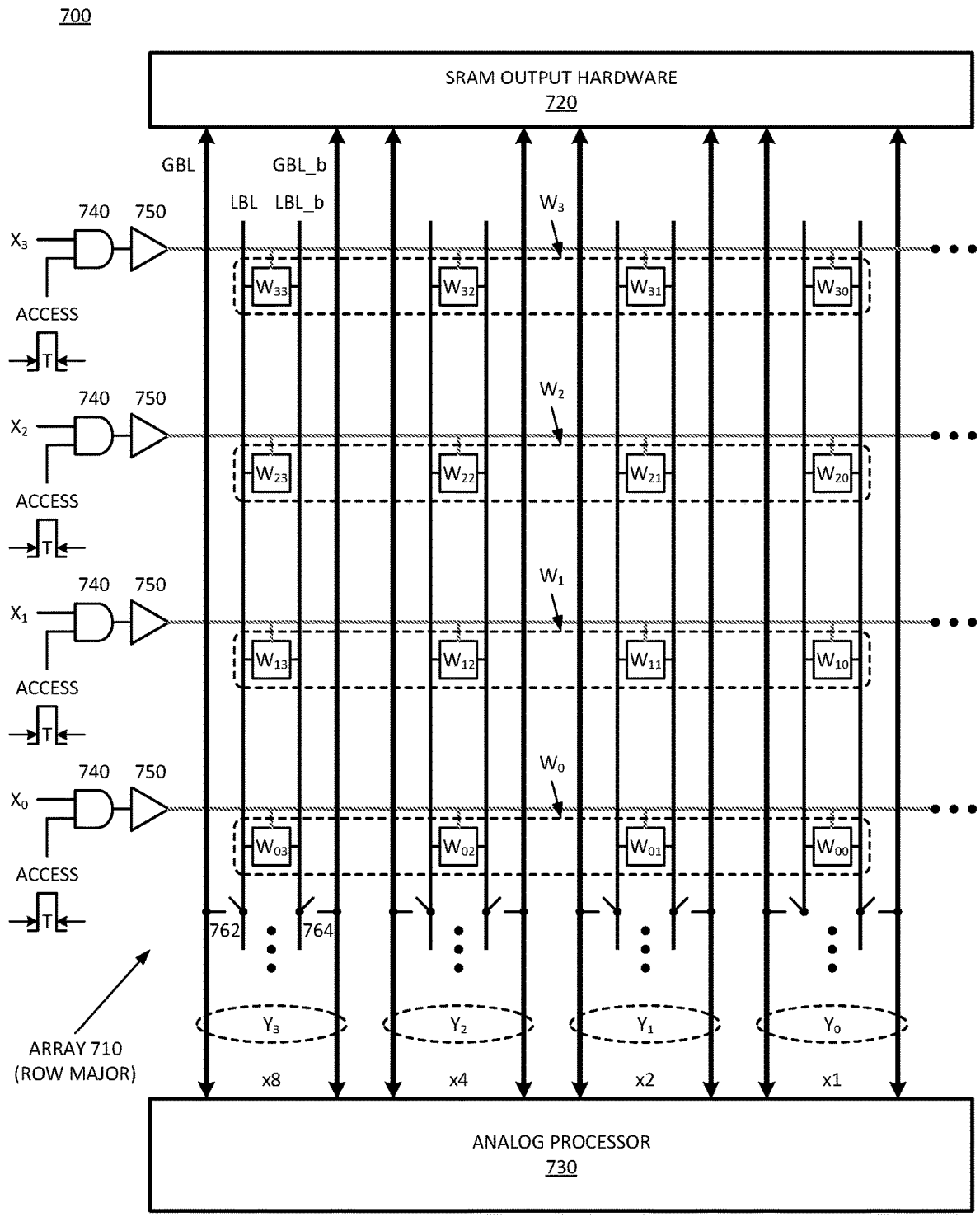
FIG. 7 is a block diagram of an example of a compute-in memory circuit that performs global charge sharing for multi-row access with a row major memory array and a differential bitline.

FIG. 7 is a block diagram of an example of a compute-in memory circuit that performs global charge sharing for multi-row access with a row major memory array and a differential bitline. System 700 is an example of a CIM array in accordance with an embodiment of system 600 of FIG. 6. System 700 illustrates elements of a memory array 710 with CIM circuitry, and it will be understood that the memory array includes more elements than what are shown. In one example, memory array 710 is an SRAM array.

System 700 includes SRAM output hardware 720, which represents hardware to precharge and sense the bitline bit values and provide a data read output. While the local bitlines are not explicitly illustrated as being connected to hardware 720, it will be understood that the bitlines are connected to circuitry to precharge the lines in preparation for a read. System 700 illustrates driver circuitry 750 to drive the wordlines, and AND gates 740 to selectively drive the WLs based on the operand vector X[i] and an access signal (Access).

The data is stored in array 710 in row major format. For system 700, assume that the leftmost column is the most significant bit, and the rightmost column is the least significant bit. The reference numbers of the bit positions are to be understood as relative to each other and are not absolute positions. The topmost WL is designated as data word $W_3$, with bits [3:0] from left to right. For example, $W_3$ bit 3 is represented as $W_{33}$. The next column is $W_3[2]$ designated as $W_{32}$, then $W_3[1]$ designated as $W_{31}$, and finally $W_3[0]$ designated as $W_{30}$. The four words W[3:0] are not necessarily in any significance, but are simply labeled 3 to 0 to designate different words, and the relative value of the numbers does not necessarily indicate anything about the significance or order of the data words. Four columns are illustrated, but it is simply a representation and is not limiting or an indication of number of words or word size. The number of words and the length of the words can be different depending on the array size and system configuration. A row can store a single word, or multiple words. A word can be a binary weight, or a multibit weight.

In one example, array 710 includes differential bitlines. In one example, differential GBLs have corresponding differential LBLs. Thus, for example, the leftmost column illustrates LBL and LBL_b (the complement), selectively connected, respectively, to GBL and GBL_b. Switch 762 can selectively connect LBL to GBL, and switch 764 can selectively connect LBL_b to GBL_b. It will be understood that a differential bitline architecture can improve the ability of analog processor 730 to read or sense the bit value of the storage cells that make up array 710, given that the sensing can be performed as a comparison of the two lines that reduces the effects of noise. It will be understood that with a differential bitline, the storage cell will discharge to one bitline or the other depending on what is stored in the cell.

In one example, the access pulses of the various wordlines of system 700 are equal, and different bit position of the words is factored when sensing the values for different columns, in contrast to the approach in system 500 of FIG. 5. Also in contrast to system 500, different operand vectors can be used to drive each WL, as opposed to driving the same operand bit to the different WLs. Thus, in one example, system 700 drives $X_3$ to bits $W_3[3:0]$ for a time period T, $X_2$ to bits $W_2[3:0]$ for a time period T, $X_1$ to bits $W_1[3:0]$ for a time period T, and $X_0$ to bits $W_0[3:0]$ for a time period T. The accumulated charge on the BLs will reflect values for all words, and analog processor 730 can resolve the computation. In one example, when all words W[3:0] are multiplied and summed in a computation sequence, there may be little to no significance of having all rows weighted the same. In one example, the different rows can be binary weighted similar to what is described for system 500, and so different, independent row computations can be performed and resolved by analog processor 730.

Analog processor 730 performs final computations on Y to reach a final computation for the functional output. As illustrated, the binary-weight of incoming bits that drive WLs are reflected by shifting to the left at the end of every functional-read. Shifting to the left at the end of every functional-read enables multiplying the next higher bit position by 2, the next higher bit position by 4, and so forth.

Figures 8, 9:
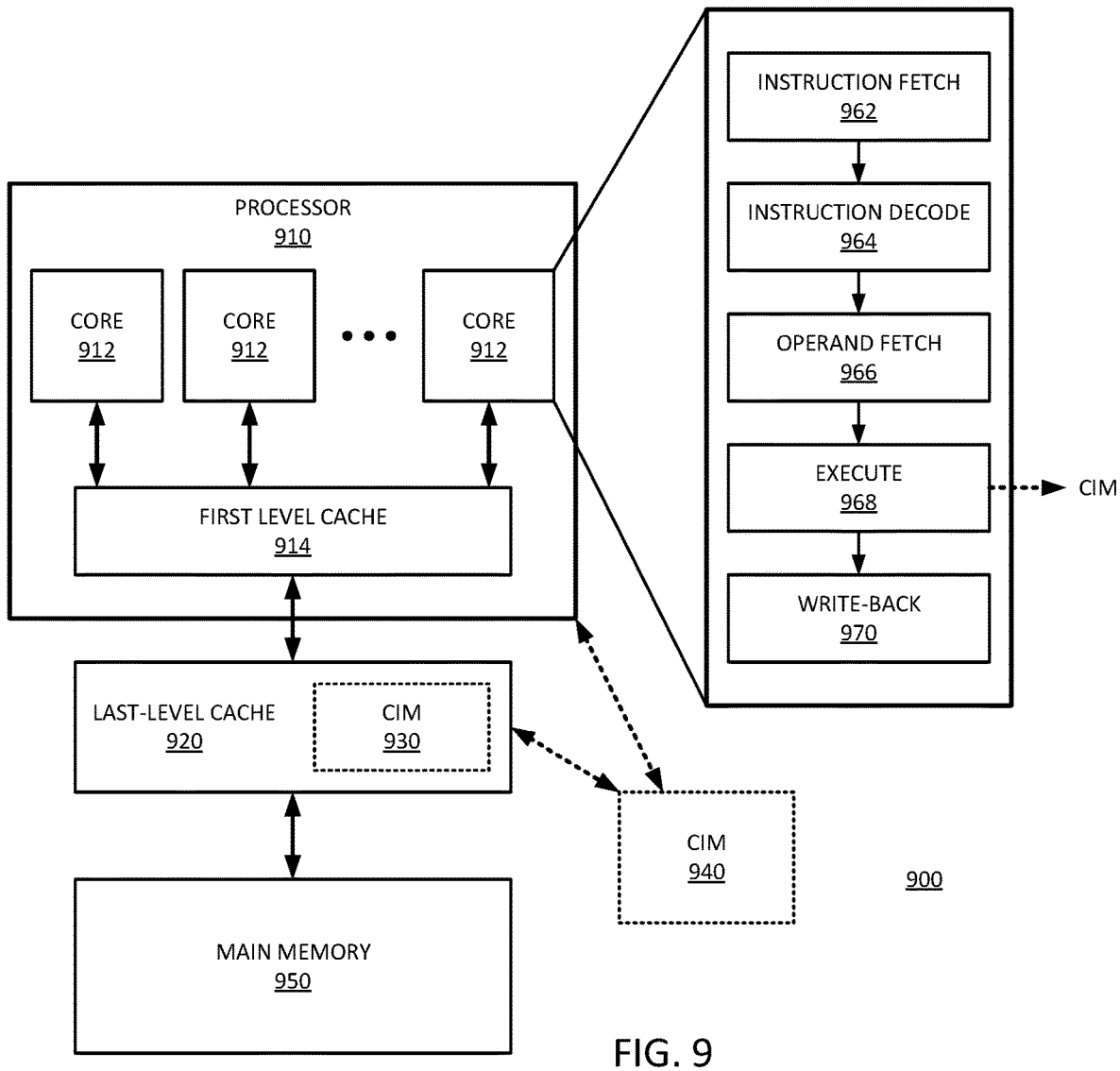
FIG. 8 is an example of code for bit-serial multiply-accumulate operation for a compute-in memory circuit.
FIG. 9 is a block diagram of an example of a system with a processor and a compute-in memory circuit that performs global charge sharing.

FIG. 8 is an example of code for bit-serial multiply-accumulate operation for a compute-in memory circuit. Code 800 provides one example of a code representation of bit serial multiply accumulate, which can be executed by CIM circuits described. Code 800 is an example of a bit serial multiply operation based MAC operation for an example case for $$Y = a*X_0 + b*X_1.$$

In one example, a logically equivalent expression Y is achieved by using an iterative loop where the X vector is multiplied bit by bit, starting from the MSB. Such an iterative bit serial approach makes the multiply equivalent to a logical AND operation.

At line 802, the code defines variable i=bit_length(X)−1, which variable can be used to iterate through the code for all bits in the vector operand X. At line 804, the code defines variable Y, initialized to zero (i.e., reset to 0). Y can be initialized to any value less than, more than, or equal to zero, before a new accumulation. At line 806 the loop is defined, and the code will loop for (i>=0) to cover all bits of X.

At every iteration for bit position i, single bit X vector operands are multiplied with multibit words {a, b}, and accumulated in a partial sum. At line 808, Y is set equal to an accumulation of a times $X_0[i]$ plus b time $X_1[i]$, or:

$$Y\mathrel{+}=a*X_0[i]+b*X_1[i].$$

In one example, the partial sum is shifted by one bit to left and the bit position index is decremented by one. At line 810, Y is set equal to the value computed above, shifted to the left:

$$Y=Y\text{<<LeftShift\_by\_1}.$$

At line 812, the value of i is decremented. The process is repeated until the bit position index reaches the LSB of {X0, X1}, where the final Y value is computed. Alternatively, the same operation can be done by starting at the LSB, and then increasing the bit position index by one at every iteration until MSB is reached, and by shifting to right. At line 814, the loop ends.

Bit serial operation can be understood as an operation that processes input activations one bit at a time. Bit serial operation has lower readout precision requirements as compared to multibit activations, which reduces the analog logic design effort. For example, for 4-bit weights, 4 subarrays, and 16-bit input operands, GBL sampling can be accomplished with 6-bit resolution before the shift operation using bit serial operation. This is true even if the final accumulated Y value is 16-bits in length.

FIG. 9 is a block diagram of an example of a system with a processor and a compute-in memory circuit that performs global charge sharing. System 900 can include a CIM circuit in accordance with any example described above. The CIM circuit can be a CIM accelerator for machine learning or other compute-intensive operation. An accelerator can be referred to as a coprocessor. In one example, the CIM circuitry provides a neural network infrastructure for computation of an artificial intelligence application.

System 900 includes processor 910, which can be or include a general purpose CPU (central processing unit), a GPU (graphics processing unit), a DSP (digital signal processor) array, or other processor. Processor 910 represents a digital processor and can be referred to as a host processor. In one example, processor 910 includes multiple cores 912. Processor 910 executes applications or software programs that access data for compute-intensive operations.

In one example, processor 910 includes first level cache 914, which represents caching resources within the processor die or processor SOC (system on a chip) that provides physically close storage resources for hot data. In one example, processor 910 includes multiple levels of on-chip/local cache, which are not explicitly shown. It will be understood that cache resources can be local to a specific core 912, shared by multiple cores 912, or a combination of shared cache resources and localized cache resources.

System 900 includes last-level cache 920. In one example, last level cache 920 is also on processor 910. In one example, last level cache 920 is off-chip from processor 910. Last level cache 920 is larger than first level cache 914 but takes longer to access. There may be any number of other cache layers between first level cache 914 and last level cache 920.

Main memory 950 represents system main memory. Main memory 950 is typically orders of magnitude larger than the cache resources, but takes much longer to access relative to the cache resources. Main memory 950 can include volatile memory resources that have indeterminate state when power is interrupted. Main memory 950 can include nonvolatile memory resources that maintain state even when power is interrupted to the memory. Caching resources are typically volatile, but can include nonvolatile memory resources.

System 900 includes a depiction of an instruction execution pipeline for core 912. In one example, each core 912 can include multiple execution pipelines (e.g., multithreading). The instruction pipeline is to be understood as a general explanation, and specific details are not provided. In one example, the instruction pipeline includes instruction fetch 962 where the core fetches the instruction to execute. Instruction decode 964 represents the decoding of the instruction by the core in preparation of the processor circuitry for execution. In one example, instruction decode 964 identifies the instruction as part of a command that triggers use of a CIM circuit for operation.

Operand fetch 966 represents the fetching or obtaining of the operands to be executed on for the instruction. In one example, the operand is a weight vector for a neural network, or other math function operand. In one example, the operands are in or are placed in register space associated with the execution pipeline. Execute 968 represents execution of the instruction on or with the operand(s). In one example, execution can include sending of the operation to CIM circuitry for execution. In one example, the instruction is sent to a processor ALU, which can trigger the execution by the CIM accelerator. Write-back 970 refers to writing execution results in a results register for return to memory, or for passing to another register for another execution. In the case of use of CIM circuitry, execution 968 and write-back 970 can include sending the operation to CIM circuitry, which will execute the operation and return a functional output, which can then be written back. Thus, the instruction that would traditionally require loading operands into an ALU or other computation engine within processor 910 can be sent to the CIM circuitry without having to read from memory, and then receiving a computation result from the CIM circuitry instead of from the local computation engine.

CIM 930 represents CIM circuitry implemented in last level cache 920. CIM 930 can be all or part of last level cache 920. In one example, last level cache 920 includes a memory array configured as a CIM circuit, and a memory array that does not include CIM circuitry. The system can selectively store data in the CIM-enabled memory array for CIM acceleration.

CIM 940 represents CIM circuitry that is separate from the cache architecture of system 900. Thus, CIM 940 represents a memory resource that is dedicated to the execution of CIM accelerated operations. Such a CIM memory can still include traditional access hardware to enable reading from the memory without performing a computation. CIM 930 and CIM 940 include CIM hardware to enable functional reads in accordance with any example described herein.

CIM 930 and CIM 940 include access paths from processor 910. When part of the cache architecture as CIM 930, the interconnection hardware can be the same as interconnection hardware for the cache devices. When not part of the cache architecture as CIM 940, the CIM interconnection can be similar or the same as a cache device, or main memory device, or other memory coupled to processor 910. CIM 930 and CIM 940 are coupled to main memory 950 (not specifically shown) to load operands for CIM acceleration operations.

In one example, invocation of a compute-intensive function triggers directing commands to the CIM accelerator. For example, processor 910 can include support in its instruction set architecture (ISA) for certain commands to trigger operation of a CIM accelerator. In one example, invocation of the CIM accelerator can be preceded by or associated with the loading of configuration information into accelerator. Such configuration information can, for example, define weights of internodal connections, define math functions to be performed, or other configuration. System 900 can load configuration information from system main memory or from nonvolatile mass storage, or a combination.

In one example, the CIM circuitry of either CIM 930 or CIM 940, or both, can include one or more levels of a neural network. In one example, after configuration of the CIM circuitry, the instruction pipeline applies input values to the configured neural network for processing. The CIM circuitry generates a resultant to write back to register space or system memory and the CIM circuitry can indicate completion of the processing to the executing thread that invoked the CIM circuitry. In one example, if the number of neural network levels or neurons per level that are physically implemented in the CIM circuitry is less than the number of levels/neurons of the neural network to be processed, the processing through the neural network can be iterated by repeatedly loading the CIM circuitry for processing until all levels of the neural network have been processed.

Figure 10:
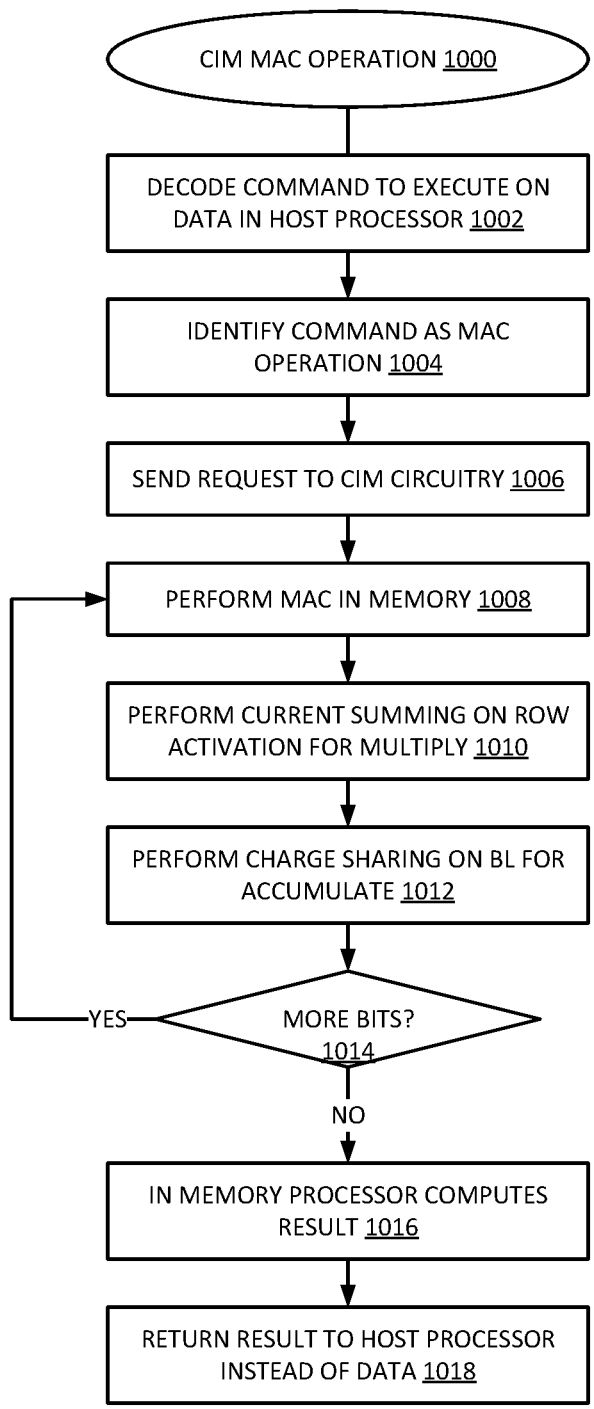
FIG. 10 is a flow diagram of an example of a process for in-memory computation.

FIG. 10 is a flow diagram of an example of a process for in-memory computation. Process 1000 represents a process for CIM MAC operation by an example of a system with CIM circuitry in accordance with what is described herein. In one example, a hardware processor or control logic for the processor decodes a command for execution of an instruction on data, block 1002. In one example, the processor logic identifies the command as a MAC operation, block 1004. While a MAC operation is specifically described, it will be understood that the operation could alternatively be any operation involving compute-intensive operation that can be accelerated with CIM circuitry. CIM circuitry can accelerate any operation that involves multiple or accumulate operations, or both, with many sequential computations. By using CIM circuitry, the data does not have to be transferred between the memory and processor, but the computation can occur at the memory, accelerating the operation while reducing the energy consumption.

For an identified MAC operation, the processor sends a request with the instruction to the CIM circuitry, block 1006. In one example, the CIM circuitry performs the operation as an iteration of multiple computations, starting at block 1008.

In one example, the CIM circuitry performs current summing on row activation for a multiply operation, block 1010. In one example, the current summing occurs in local bitlines. In one example, the current summing occurs on the activation of multiple rows in parallel. In one example, the CIM circuitry performs charge sharing on bitline for an accumulate operation, block 1012. In one example, charge sharing bitline refers to a global bitline that accumulates charge from one or more local bitlines.

After the computation operations if there are more bits to process in the operand of the instruction, block 1014 YES branch, process 1000 returns to block 1008 for another iteration. If there are no more bits to process, block 1014 NO branch, an in memory processor finalizes a result, block 1016. The in memory processor can be an analog processor to sense and perform operations on the bitline charge. In one example, the analog processor senses the charge, converts the charge to a digital value, and performs shift operations on the digital value. Eventually the analog processor converts the result into a digital value to return as a result. The in memory processor can be referred to as an analog processor if it performs operations on the bitline charge. In one example, the analog processor includes analog circuitry to sense the charge, and one or more digital blocks to perform additional processing. The processor returns a functional read result to the host processor that invoked the CIM circuitry, instead of returning data for computation by the host processor, block 1018.

Figure 11:
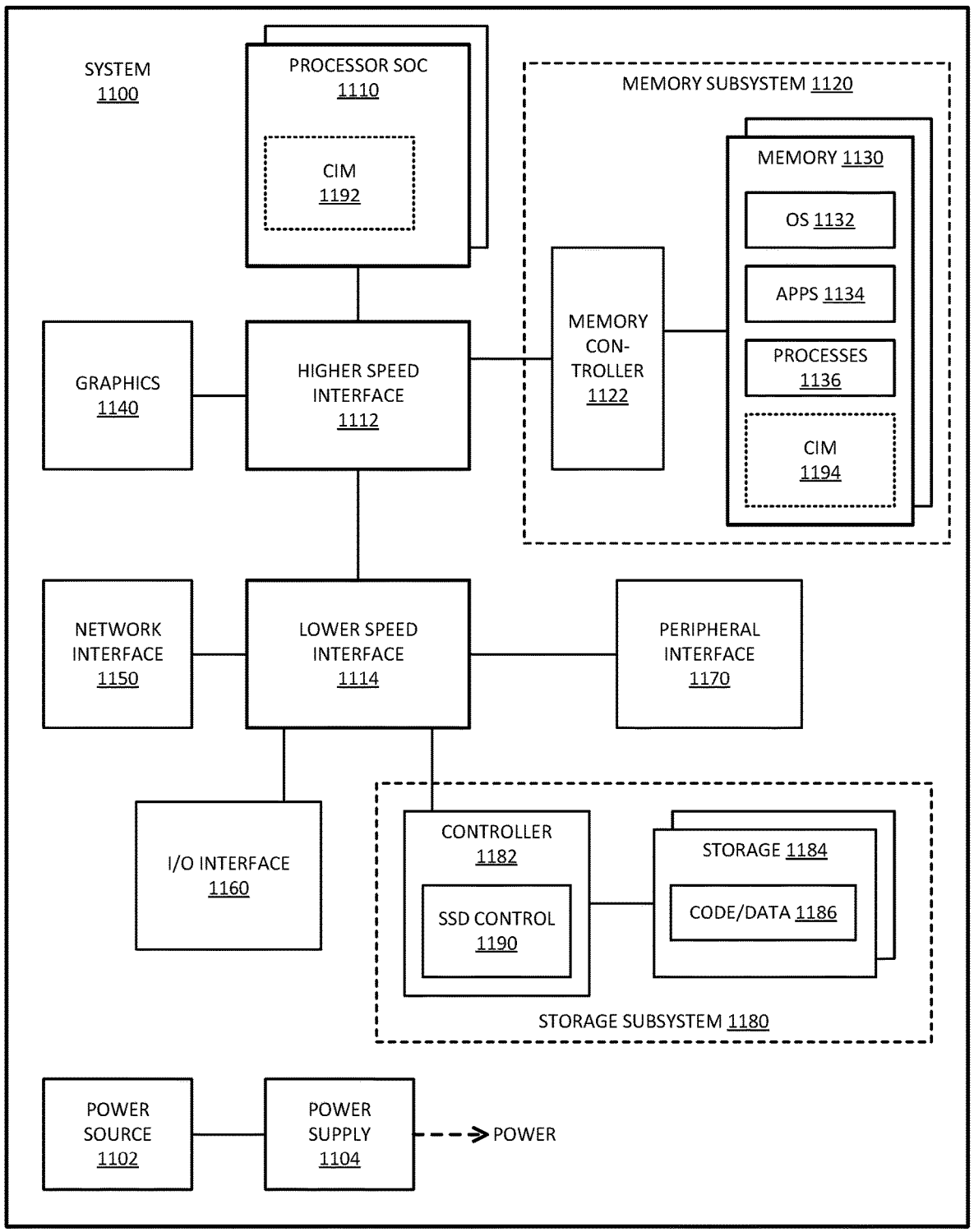
FIG. 11 is a block diagram of an example of a computing system in which compute-in-memory (CIM) operations can be implemented.

FIG. 11 is a block diagram of an example of a computing system in which compute-in-memory (CIM) operations can be implemented. System 1100 represents a computing device in accordance with any example herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

In one example, system 1100 includes CIM circuitry. The CIM circuitry can be in accordance with any example described herein. One example of CIM circuitry can be CIM 1192, which is represented as CIM circuitry included in processor SOC 1110. CIM 1192 can be or include CIM circuitry in a memory device on the processor SOC substrate or die. For example, CIM 1192 can be a cache or a portion of a cache on processor SOC 1110. Another example of CIM circuitry can be CIM 1194, which is represented as CIM circuitry included in memory subsystem 1120. More specifically, CIM 1194 is illustrated as part of memory 1130, referring to the memory resources of system 1100. CIM 1194 represents CIM circuitry that can be included as a memory resource to which processor SOC 1110 can offload compute-intensive operations. In one example, the memory arrays of either CIM 1192 or CIM 1194 can be dedicated to storing data for CIM acceleration. In one example, CIM 1192 or CIM 1194 are used as regular memory resources, and can also help with CIM acceleration.

System 1100 includes processor SOC 1110 (referred to subsequently as "processor 1110"), which provides processing, operation management, and execution of instructions for system 1100. Processor 1110 can include any type of microprocessor, central processing unit (CPU), graphics processing unit (GPU), processing core, or other processing hardware to provide processing for system 1100, or a combination of processors. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1100 includes interface 1112 coupled to processor 1110, which can represent a higher speed interface or a high throughput interface for system components that needs higher bandwidth connections, such as memory subsystem 1120 or graphics interface components 1140. Interface 1112 represents an interface circuit, which can be a standalone component or integrated onto a processor die. Where present, graphics interface 1140 interfaces to graphics components for providing a visual display to a user of system 1100. In one example, graphics interface 1140 can drive a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. In one example, the display can include a touchscreen display. In one example, graphics interface 1140 generates a display based on data stored in memory 1130 or based on operations executed by processor 1110 or both. In one example, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more memory devices 1130 such as read-only memory (ROM), flash memory, one or more varieties of random access memory (RAM) such as DRAM, or other memory devices, or a combination of such devices. Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide software logic to provide functions for system 1100. In one example, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 1100 includes interface 1114, which can be coupled to interface 1112. Interface 1114 can be a lower speed interface than interface 1112. In one example, interface 1114 represents an interface circuit, which can include standalone components and integrated circuitry. In one example, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, cellular network interconnection components, USB (universal serial bus), or other wired or wireless standards-based or proprietary interfaces. Network interface 1150 can exchange data with a remote device, which can include sending data stored in memory or receiving data to be stored in memory.

In one example, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one example, system 1100 includes storage subsystem 1180 to store data in a nonvolatile manner. In one example, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one example, storage subsystem 1180 includes controller 1182 to interface with storage 1184. In one example controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one example, power supply 1104 includes an AC to DC (alternating current to direct current) adapter to plug into a wall outlet. Such AC power can be renewable energy (e.g., solar power) power source 1102. In one example, power source 1102 includes a DC power source, such as an external AC to DC converter. In one example, power source 1102 or power supply 1104 includes wireless charging hardware to charge via proximity to a charging field. In one example, power source 1102 can include an internal battery or fuel cell source.

Figure 12:
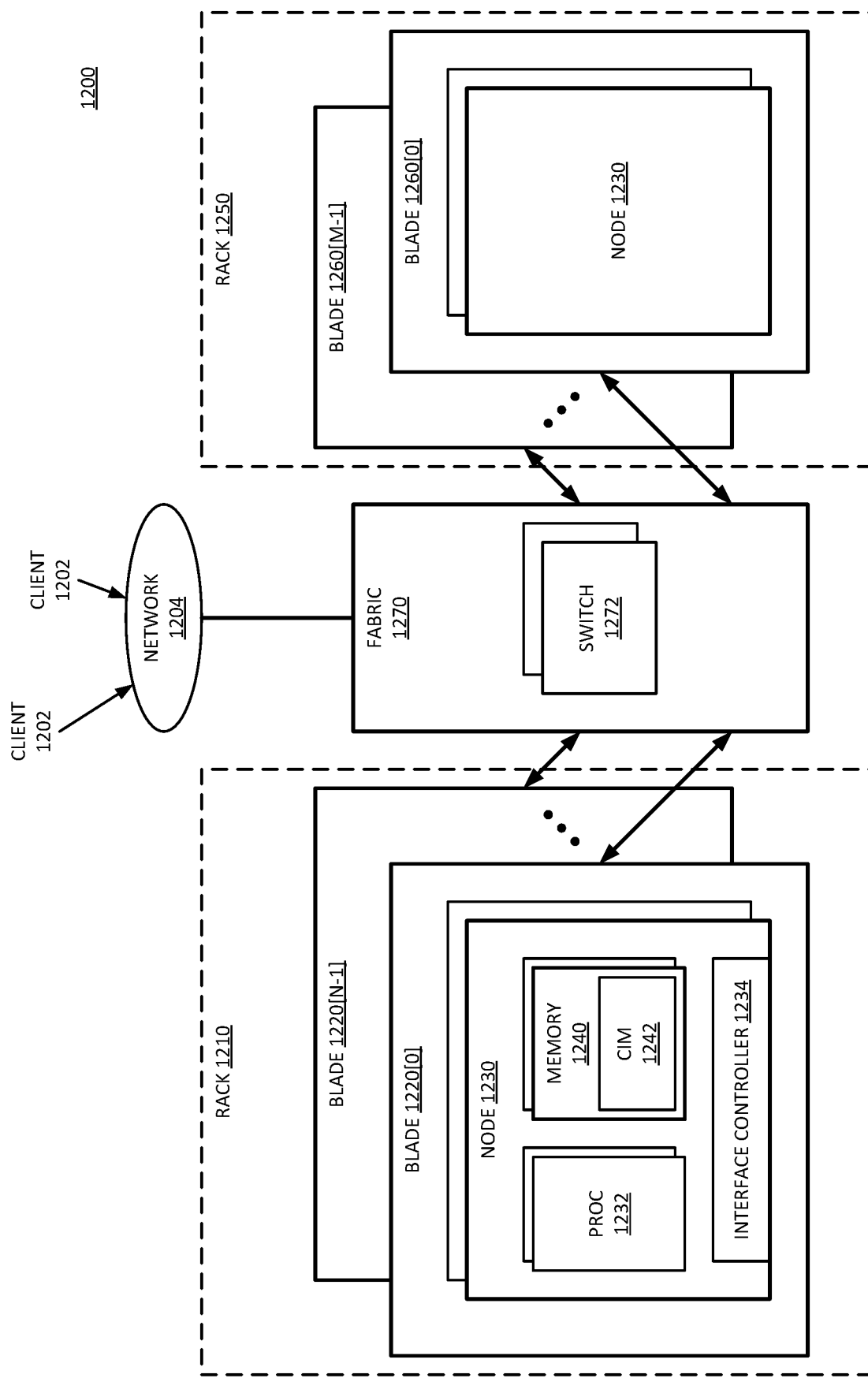
FIG. 12 is a block diagram of an example of a multi-node network in which compute-in-memory (CIM) operations can be implemented.

FIG. 12 is a block diagram of an example of a multi-node network in which compute-in-memory (CIM) operations can be implemented. System 1200 represents a network of nodes in accordance with any example described herein. In one example, system 1200 represents a data center. In one example, system 1200 represents a server farm. In one example, system 1200 represents a data cloud or a processing cloud.

In one example, node 1230 includes memory 1240, which includes CIM 1242. CIM 1242 represents CIM circuitry in accordance with any description herein. With CIM 1242, memory 1240 becomes a computation resource for node 1230. More specifically, CIM 1242 enables node 1230 to provide improved processing of workloads that are both memory/data intensive as well as compute intensive. Instead of moving data back and forth from memory to processor, CIM 1242 enables the memory to perform computations and return a functional result to the calling processor 1232. CIM 1242 can be implemented as a standalone resource within memory 1240. In one example, CIM 1242 is implemented as a cache on processor 1232. In one example, CIM 1242 is a separate blade as an accelerator for a blade of processor resources.

One or more clients 1202 make requests over network 1204 to system 1200. Network 1204 represents one or more local networks, or wide area networks, or a combination. Clients 1202 can be human or machine clients, which generate requests for the execution of operations by system 1200. System 1200 executes applications or data computation tasks requested by clients 1202.

In one example, system 1200 includes one or more racks, which represent structural and interconnect resources to house and interconnect multiple computation nodes. In one example, rack 1210 includes multiple nodes 1230. In one example, rack 1210 hosts multiple blade components 1220. Hosting refers to providing power, structural or mechanical support, and interconnection. Blades 1220 can refer to computing resources on printed circuit boards (PCBs), where a PCB houses the hardware components for one or more nodes 1230. In one example, blades 1220 do not include a chassis or housing or other "box" other than that provided by rack 1210. In one example, blades 1220 include housing with exposed connector to connect into rack 1210. In one example, system 1200 does not include rack 1210, and each blade 1220 includes a chassis or housing that can stack or otherwise reside in close proximity to other blades and allow interconnection of nodes 1230.

System 1200 includes fabric 1270, which represents one or more interconnectors for nodes 1230. In one example, fabric 1270 includes multiple switches 1272 or routers or other hardware to route signals among nodes 1230. Additionally, fabric 1270 can couple system 1200 to network 1204 for access by clients 1202. In addition to routing equipment, fabric 1270 can be considered to include the cables or ports or other hardware equipment to couples nodes 1230 together. In one example, fabric 1270 has one or more associated protocols to manage the routing of signals through system 1200. In one example, the protocol or protocols is at least partly dependent on the hardware equipment used in system 1200.

As illustrated, rack 1210 includes N blades 1220. In one example, in addition to rack 1210, system 1200 includes rack 1250. As illustrated, rack 1250 includes M blades 1260. M is not necessarily the same as N; thus, it will be understood that various different hardware equipment components could be used, and coupled together into system 1200 over fabric 1270. Blades 1260 can be the same or similar to blades 1220. Nodes 1230 can be any type of node and are not necessarily all the same type of node. System 1200 is not limited to being homogenous, nor is it limited to not being homogenous.

For simplicity, only the node in blade 1220[0] is illustrated in detail. However, other nodes in system 1200 can be the same or similar. At least some nodes 1230 are computation nodes, with processor (proc) 1232 and memory 1240. A computation node refers to a node with processing resources (e.g., one or more processors) that executes an operating system and can receive and process one or more tasks. In one example, at least some nodes 1230 are server nodes with a server as processing resources represented by processor 1232 and memory 1240. A storage server refers to a node with more storage resources than a computation node, and rather than having processors for the execution of tasks, a storage server includes processing resources to manage access to the storage nodes within the storage server.

In one example, node 1230 includes interface controller 1234, which represents logic to control access by node 1230 to fabric 1270. The logic can include hardware resources to interconnect to the physical interconnection hardware. The logic can include software or firmware logic to manage the interconnection. In one example, interface controller 1234 is or includes a host fabric interface, which can be a fabric interface in accordance with any example described herein.

Processor 1232 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1240 can be or include memory devices and a memory controller.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint (3DXP) memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In general with respect to the descriptions herein, in one example a memory circuit having a memory array includes: row access circuitry to drive multiple rows of the memory array in accordance with a bit pattern of a first data word to multiply with a second data word stored in the memory array; column access circuitry to drive a column of the memory array when the rows are driven; sensing circuitry coupled to the column, to sense voltage on the column; and a processor in the memory circuit to compute a multiply-accumulate (MAC) value based on the voltage sensed on the column.

In one example, the memory array includes 6-transistor (6T) static random access memory (SRAM) cells, 8-transistor (8T) SRAM cells, or 10-transistor (10T) SRAM cells at intersections of the rows with the column. In one example, the memory array includes resistive-based random access memory (RAM) cells at intersections of the rows with the column. In one example, the column access circuitry comprises both local bitlines that connect to only a partition of rows of the memory array, and global bitlines that connect the local bitlines together for a column address. In one example, the memory array is to store the second data word in column major format, where consecutive bits of the second data word are to be stored at a same column address of different rows. In one example, the row access circuitry is to drive the multiple rows with a same bit of the first data word with binary weighting for bit serial operation. In one example, the memory array is to store the second data word in row major format, where consecutive bits of the second data word are to be stored at sequential column addresses of a same row. In one example, the row access circuitry is to drive the multiple rows with the same bit position of multiple first data words with binary weighting for bit serial operation. In one example, the processor is to perform shift operations for consecutive read operations on column addresses to weight the bits of the second data word.

In general with respect to the descriptions herein, in one example a computing device includes: a host processor; a memory device including a memory array; and a compute-in-memory circuit including wordline access circuitry to drive multiple wordlines of the memory array in accordance with a bit pattern of a first data word to multiply with a second data word stored in the memory array; bitline access circuitry to drive a bitline of the memory array when the wordlines are driven; and sensing circuitry coupled to the bitline, to sense voltage on the bitline; and a memory processor in the memory device to compute a multiply-accumulate (MAC) value based on voltage sensed on bitline.

In one example, the memory array includes 6-transistor (6T) static random access memory (SRAM) cells, 8-transistor (8T) SRAM cells, or 10-transistor (10T) SRAM cells at intersections of the wordlines with the bitlines. In one example, the memory array includes resistive-based random access memory (RAM) cells at intersections of the wordlines with the bitlines. In one example, the bitline access circuitry comprises both local bitlines that connect to only a partition of rows of the memory array, and global bitlines that connect the local bitlines together for a column address. In one example, the memory array is to store the second data word in column major format, where consecutive bits of the second data word are to be stored at a same column address of different wordlines. In one example, the wordline access circuitry is to drive the multiple wordlines with a same bit of the first data word with binary weighting for bit serial operation. In one example, the memory array is to store the second data word in row major format, where consecutive bits of the second data word are to be stored at sequential column addresses of a same wordline. In one example, the wordline access circuitry is to drive the multiple wordlines with the same bit position of multiple first data words with binary weighting for bit serial operation. In one example, the memory processor is to perform shift operations for consecutive read operations on column addresses to weight the bits of the second data word. In one example, the host processor comprises a multicore central processing unit (CPU) or a multicore graphics processing unit (GPU). In one example, the computing device further includes: a display communicatively coupled to host processor; a network interface communicatively coupled to host processor; or a battery to power the computing device.

In general with respect to the descriptions herein, in one example a method in a memory circuit includes: driving multiple rows of a memory array in accordance with a bit pattern of a first data word to multiply with a second data word stored in the memory array; driving a column of the memory array when the rows are driven; sensing voltage on the column; and computing a multiply-accumulate (MAC) value based on the voltage sensed on the column.

In general with respect to the descriptions herein, in one example an apparatus includes: means for driving multiple rows of a memory array in accordance with a bit pattern of a first data word to multiply with a second data word stored in the memory array; means for driving a column of the memory array when the rows are driven; means for sensing voltage on the column; and means for computing a multiply-accumulate (MAC) value based on the voltage sensed on the column.

In general with respect to the descriptions herein, in one example an article of manufacture comprising a computer readable storage medium having content storage thereon, which when accessed provides instructions to cause a machine to perform operations to execute a method including: driving multiple rows of a memory array in accordance with a bit pattern of a first data word to multiply with a second data word stored in the memory array; driving a column of the memory array when the rows are driven; sensing voltage on the column; and computing a multiply-accumulate (MAC) value based on the voltage sensed on the column.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory circuit having a memory array, comprising:
    row access circuitry to drive multiple rows of the memory array in accordance with a bit pattern of a first data word to multiply with a second data word stored in the memory array;
    column access circuitry to drive a column of the memory array when the rows are driven;
    sensing circuitry coupled to the column, to sense voltage on the column; and
    a processor in the memory circuit to compute a multiply-accumulate (MAC) value based on the voltage sensed on the column.

2. The memory circuit of claim 1, wherein the memory array includes 6-transistor (6T) static random access memory (SRAM) cells, 8-transistor (8T) SRAM cells, or 10-transistor (10T) SRAM cells at intersections of the rows with the column.

3. The memory circuit of claim 1, wherein the memory array includes resistive-based random access memory (RAM) cells at intersections of the rows with the column.

4. The memory circuit of claim 1, wherein the column access circuitry comprises both local bitlines that connect to only a partition of rows of the memory array, and global bitlines that connect the local bitlines together for a column address.

5. The memory circuit of claim 1, wherein the memory array is to store the second data word in column major format, where consecutive bits of the second data word are to be stored at a same column address of different rows.

6. The memory circuit of claim 5, wherein the row access circuitry is to drive the multiple rows with a same bit of the first data word with binary weighting for bit serial operation.

7. The memory circuit of claim 1, wherein the memory array is to store the second data word in row major format, where consecutive bits of the second data word are to be stored at sequential column addresses of a same row.

8. The memory circuit of claim 7, wherein the row access circuitry is to drive the multiple rows with the same bit position of multiple first data words with binary weighting for bit serial operation.

9. The memory circuit of claim 1, wherein the processor is to perform shift operations for consecutive read operations on column addresses to weight the bits of the second data word.

10. A computing device, comprising:
    a host processor;
    a memory device including a memory array; and
    a compute-in-memory circuit including
        wordline access circuitry to drive multiple wordlines of the memory array in accordance with a bit pattern of a first data word to multiply with a second data word stored in the memory array;
        bitline access circuitry to drive a bitline of the memory array when the wordlines are driven; and
        sensing circuitry coupled to the bitline, to sense voltage on the bitline; and
        a memory processor in the memory device to compute a multiply-accumulate (MAC) value based on voltage sensed on bitline.

11. The computing device of claim 10, wherein the memory array includes 6-transistor (6T) static random access memory (SRAM) cells, 8-transistor (8T) SRAM cells, or 10-transistor (10T) SRAM cells at intersections of the wordlines with the bitlines.

12. The computing device of claim 10, wherein the memory array includes resistive-based random access memory (RAM) cells at intersections of the wordlines with the bitlines.

13. The computing device of claim 10, wherein the bitline access circuitry comprises both local bitlines that connect to only a partition of rows of the memory array, and global bitlines that connect the local bitlines together for a column address.

14. The computing device of claim 10, wherein the memory array is to store the second data word in column major format, where consecutive bits of the second data word are to be stored at a same column address of different wordlines.

15. The computing device of claim 14, wherein the wordline access circuitry is to drive the multiple wordlines with a same bit of the first data word with binary weighting for bit serial operation.

16. The computing device of claim 10, wherein the memory array is to store the second data word in row major format, where consecutive bits of the second data word are to be stored at sequential column addresses of a same wordline.

17. The computing device of claim 16, wherein the wordline access circuitry is to drive the multiple wordlines with the same bit position of multiple first data words with binary weighting for bit serial operation.

18. The computing device of claim 10, wherein the memory processor is to perform shift operations for consecutive read operations on column addresses to weight the bits of the second data word.

19. The computing device of claim 10, wherein the host processor comprises a multicore central processing unit (CPU) or a multicore graphics processing unit (GPU).

20. The computing device of claim 10, further comprising:
- a display communicatively coupled to host processor;
- a network interface communicatively coupled to host processor; or
- a battery to power the computing device.

* * * * *